United States Patent
Kinyua et al.

(10) Patent No.: US 9,998,131 B1
(45) Date of Patent: Jun. 12, 2018

(54) HYBRID ANALOG-TO-DIGITAL CONVERTER

(71) Applicant: Taiwan Semiconductor Manufacturing Co., Ltd., Hsin-Chu (TW)

(72) Inventors: Martin Kinyua, Cedar Park, TX (US); Miguel Gandara, San Jose, CA (US); Eric Soenen, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/586,015

(22) Filed: May 3, 2017

Related U.S. Application Data

(60) Provisional application No. 62/434,321, filed on Dec. 14, 2016.

(51) Int. Cl.
   *H03M 1/00* (2006.01)
(52) U.S. Cl.
   CPC ........... *H03M 1/001* (2013.01); *H03M 1/002* (2013.01)
(58) Field of Classification Search
   CPC .............................. H03M 1/001; H03M 1/002
   USPC .................................................. 341/110–155
   See application file for complete search history.

(56) References Cited

U.S. PATENT DOCUMENTS

| | | | | |
|---|---|---|---|---|
| 6,281,831 B1 * | 8/2001 | Shou | ........................ | H03M 1/42 327/75 |
| 6,369,140 B1 * | 4/2002 | Staniek | .................... | C08K 5/50 524/116 |
| 6,580,714 B1 * | 6/2003 | Nishizaki | ............ | H04L 12/5601 370/395.1 |
| 6,741,194 B1 * | 5/2004 | Cassagnes | ............ | H03M 1/129 341/118 |
| 7,612,700 B2 * | 11/2009 | Kawahito | ............. | H03M 1/002 341/161 |
| 8,624,635 B2 * | 1/2014 | Chang | ....................... | H03K 6/00 327/341 |

(Continued)

OTHER PUBLICATIONS

Lim, Y. et al., "A 100MS/s, 10.5 Bit, 2.46 mW Comparator-Less Pipeline ADC Using Self-Biased Ring Amplifiers", IEEE Journal of Solid-State Circuits, Oct. 2015, 50(10):2331-2341.

(Continued)

*Primary Examiner* — Lam T Mai
(74) *Attorney, Agent, or Firm* — Duane Morris LLP

(57) ABSTRACT

An analog-to-digital converter (ADC) circuit includes a first ADC stage comprising a first successive approximation register (SAR) circuit that is configured to convert a current analog input signal into a first digital signal corresponding to a most-significant-bits (MSB) portion of a current digital output signal, and to generate a residual voltage corresponding to a voltage value difference between the current analog input signal and the first digital signal; a second ADC stage, coupled to the first ADC stage, comprising an amplifier circuit that is configured to amplify the residual voltage; and a third ADC stage, coupled to the second ADC stage, comprising a second SAR circuit that is configured to convert the amplified residual voltage into a second digital signal corresponding to a least-significant-bits (LSB) portion of the current digital output signal when the first SAR circuit receives a subsequent analog input signal.

20 Claims, 9 Drawing Sheets

(56) References Cited

U.S. PATENT DOCUMENTS

| | | | | |
|---|---|---|---|---|
| 9,008,334 | B2* | 4/2015 | Ayres | H03G 3/301 |
| | | | | 381/107 |
| 9,143,144 | B2* | 9/2015 | Kuppambatti | G06F 1/08 |
| 9,219,492 | B1* | 12/2015 | Lok | H03M 1/002 |
| 9,654,135 | B2* | 5/2017 | Miki | H03M 1/468 |
| 2004/0070530 | A1* | 4/2004 | You | H03M 1/069 |
| | | | | 341/163 |
| 2005/0078025 | A1* | 4/2005 | Cai | H03M 1/164 |
| | | | | 341/162 |
| 2010/0073214 | A1* | 3/2010 | Kawahito | H03F 3/45237 |
| | | | | 341/155 |

OTHER PUBLICATIONS

Yang, W. et al., "A 3-V 340-mW 14-b 75-Msample/s CMOS ADC With 85-dB SFDR at Nyquist Input", IEEE Journal of Solid-State Circuits, Dec. 2001, 36(12):1931-1936.

\* cited by examiner

HYBRID ANALOG-TO-DIGITAL CONVERTER

CROSS-REFERENCE TO RELATED APPLICATION

The present application claims priority to U.S. Provisional Patent Application No. 62/434,321, filed on Dec. 14, 2016, which is incorporated by reference herein in its entirety.

BACKGROUND

An analog-to-digital converter (ADC) is a circuit element that converts an analog signal to digital data. For example, digital data can include a number of different digital codes, and each of the digital codes can correspond to a unique voltage or current level of the analog signal.

Advances in complimentary metal-oxide semiconductor (CMOS) technologies have dramatically improved performance of systems (e.g., a system-on-chip (SoC) circuit) which generally require an ADC as an interface. As the performance of such systems continues to improve, performance of analog-to-digital conversion is becoming more important as analog-to-digital conversion is starting to become the system bottleneck in performance as well as power consumption. In addition to the concern of power consumption, some of the challenges in designing an ADC in such sealed CMOS technologies include, for example, a higher resolution, a higher sampling rate leading to a higher bandwidth, etc.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
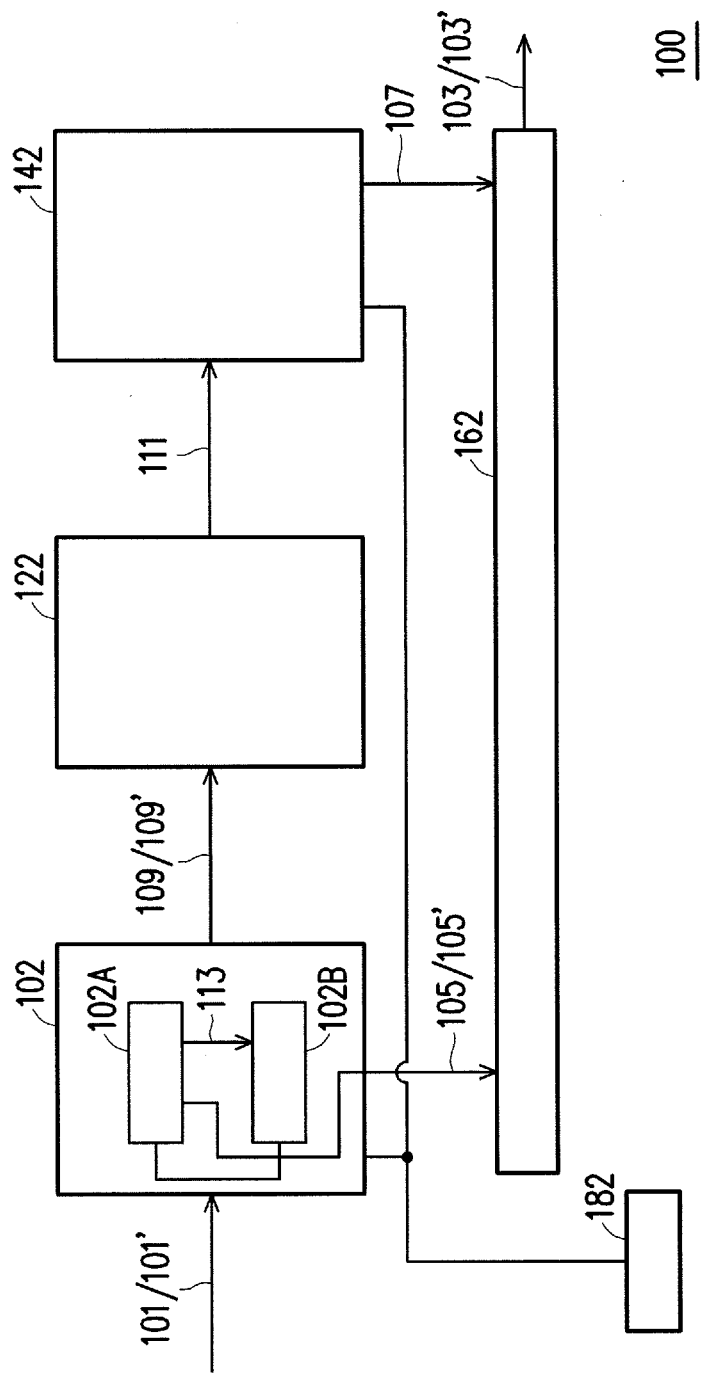
FIG. 1 illustrates an exemplary block diagram of a hybrid analog-to-digital converter (ADC), in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

As mentioned above, in designing an ADC in the scaled CMOS technologies, the challenges include optimizing the resolution and the conversion rate of the ADC. Such challenges become more difficult to overcome while simultaneously optimizing the resolution and the conversion rate of the ADC since a trade-off between these two benchmarks is typically present. The term "resolution," as used herein, refers to a number of discrete values the ADC can provide over a range of an analog signal. Such values are stored in a binary form, and thus the resolution is typically expressed in "bits." The term "conversion rate," as used herein, refers to how fast the ADC can sample an analog signal or how many samples the ADC can provide during a certain period of time, which is typically expressed as "samples/second" or "Hz." For example, some ADC's may present a faster conversion rate than other ADC's but typically have a limited (lower) resolution; and some ADC's may present a higher resolution than other ADC's but have a slower conversion rate.

The present disclosure provides various embodiments of a hybrid ADC that can balance the trade-off between the resolution and conversion rate. Moreover, while maintaining an optimal balance between the resolution and the conversion rate, the hybrid ADC can further balance trade-offs associated with power consumption, susceptibility to process, voltage, and temperature (PVT) variations, etc. In a non-limiting example, the hybrid ADC has a higher resolution and relatively lower power consumption than a conventional pipelined ADC (that typically suffers lower resolution and higher power consumption) while maintaining a faster conversion rate when compared to a conventional SAR ADC (that typically presents a higher resolution but suffer lower conversion rate).

In some embodiments, the hybrid ADC includes three functional blocks (circuits) that are coupled to one another. More specifically, these three functional circuits include a first successive approximation register (SAR) circuit deployed at a front-end, a low-voltage residue amplifier (RA) circuit deployed after the first SAR, and a second SAR circuit deployed at a back-end of the hybrid ADC, respectively. Such three main functional circuits each performs a respective function in one of three sequential phases (in time). Alternatively stated, in accordance with some embodiments, the first SAR circuit, the RA circuit, and the second SAR circuit operate as a pipelined circuit and each performs a respective function in a certain phase during operations of such a pipelined hybrid ADC.

By deploying and operating the first SAR circuit, the RA circuit, and the second SAR circuit in such a hybrid and pipelined fashion, the respective advantageous benchmarks of the conventional pipelined ADC (e.g., a relatively fast conversion rate, etc.) and SAR ADC (e.g., a relatively high resolution, etc.) can be simultaneously combined, which allows the hybrid ADC of the present disclosure to provide a favorable resolution without compromising its conversion rate. Further, the hybrid ADC avoids using a high-gain amplifier that is typically used in the conventional pipelined ADC, which advantageously reduces the hybrid ADC's power consumption. Still further, the RA circuit uses a process-tracking current source, which advantageously improves the hybrid ADC's immunity to PVT variations.

FIG. 1 illustrates an exemplary block diagram of a hybrid ADC 100, in accordance with various embodiments. As shown, the hybrid ADC 100 includes a first successive approximation register (SAR) circuit 102, a residue amplifier (RA) circuit 122, a second SAR circuit 142, an error correction circuit 162, and a control logic circuit 182. Each of the blocks 102, 122, 142, 162, and 182 may include one or more circuits that each performs a respective function, which will be discussed in further detail below.

In some embodiments, the hybrid ADC 100 converts an analog input signal (e.g., an analog voltage signal) 101 to a digital output signal 103 representative of the analog input signal 101 in a digital format. Such a digital output signal 103, generated based on a first digital signal 105 output by the first SAR circuit 102 and a second digital signal 107 output by the second SAR circuit 142, may be output by the error correction circuit 162. By using the first SAR circuit 102, the RA circuit 122, and the second SAR circuit 142 to perform respective functions of three sequential phases in a pipelined fashion, the digital signals 105 and 107 can be respectively provided. Accordingly, the digital output signal 103, which is based on the digital signals 105 and 107, can be provided by the error correction circuit 162. In some embodiments, the control logic circuit 182, coupled to the first SAR circuit 102, the RA circuit 122, and the second SAR circuit 142, may be configured to control which function each of the first SAR circuit 102, the RA circuit 122, and the second SAR circuit 142 is configured to perform in each phase. General operations of the hybrid ADC 100 will be described below in conjunction with Table 1. Detailed operations of the hybrid ADC 100 will be further described below with respect to FIG. 6.

TABLE 1

| Phase | First SAR Circuit 102 | RA Circuit 122 | Second SAR Circuit 142 |
|---|---|---|---|
| phase 1 | Sample current analog input signal | Disabled | Idle/Convert residue of previous analog input signal |
| phase 2 | Convert current analog input signal | Auto-Zero | Idle/Convert residue of previous analog input signal |
| phase 3 | Hold residual signal of the current analog input signal | Amplify residual signal of the current analog input signal | Sample amplified residual signal of the current analog input signal |

In some embodiments, when the hybrid ADC 100 initially receives a first analog input signal e.g., 101, the control logic circuit 182 of the hybrid ADC 100 controls the first SAR circuit 102, the RA circuit 122, and the second SAR circuit 142 to perform the respective operations of phase 1 as specified in Table 1 above. In phase 1, the first SAR circuit 102 is configured to sample the first analog input signal 101; the RA circuit 122 is configured to be disabled; and the second SAR circuit 142 is configured to be in an idle mode. The term "sample," as used herein, refers to an operation for extracting an analog value for a continuous and time-varying signal at a specific time.

After the first SAR circuit 102 finishes sampling the first analog input signal 101, the control logic circuit 182 controls the first SAR circuit 102, the RA circuit 122, and the second SAR circuit 142 to perform the operations of phase 2 as indicated in Table 1 above. In phase 2, the first SAR circuit 102 is configured to convert the sampled first analog input signal 101 into the first digital signal 105 that, in some embodiments, corresponds to a most-significant-bits (MSB) portion of the digital output signal 103, and further provide a residual voltage signal 109 that corresponds to a difference in voltage value between the analog input voltage 101 and the first digital signal 105; the RA circuit 122 is configured to transition to an "auto-zero" mode that is configured to clear out an input offset, if any, present at input ends of the RA circuit 122, which causes the RA circuit 122 to be ready to perform amplification; and the second SAR circuit 142 is still configured to be in the idle mode.

After the residual voltage signal 109 is provided to the RA circuit 122, the control logic circuit 182 controls the first SAR circuit 102, the RA circuit 122, and the second SAR circuit 142 to perform the operations of phase 3 as specified in Table 1 above. In phase 3, the first SAR circuit 102 is configured to hold the residual voltage signal 109; the RA circuit 122 is configured to amplify the residual voltage signal 109 so as to provide an amplified residual voltage signal 111 to the second RA circuit 142; and the second RA circuit 142 is configured to sample the amplified residual voltage signal 111. In some embodiments, the operations performed by the respective circuits (102, 122, and 142) of the hybrid ADC 100 during the phases 1, 2, and 3 may be referred to as an "iteration," and the above-discussed operations performed on the first analog input signal 101 may be referred to as a first iteration.

Subsequently, the hybrid ADC 100 receives a second analog input signal, e.g., 101'. As such, the hybrid ADC 100 is configured to operate through a second iteration. That is, the hybrid ADC 100 again transitions to operate in phase 1 so that the first SAR circuit 102 samples the second analog input signal 101', and the RA circuit 122 is again disabled. However, in such a phase 1 of the second iteration, since the second SAR circuit 142 has already sampled the amplified residual voltage signal 109 (part of the previously received analog input signal 101) in phase 3 of the first iteration, the second SAR circuit 142 is configured to convert the amplified residual voltage signal 111 into the digital signal 107 that corresponds to a least-significant-bits (LSB) portion of the digital output signal 103.

Similarly, after the first SAR circuit 102 samples the second analog input signal 101', the hybrid ADC 100 proceeds to perform operations in phase 2 with respect to the second analog input signal 101'. In some embodiments, in phase 2 of the second iteration, the first SAR circuit 102 converts the sampled first analog input signal 101' into a first digital signal 105' that corresponds to a MSB portion of a digital output signal 103', and further provides a residual voltage signal 109' that corresponds to a difference in voltage value between the analog input voltage 101' and the first digital signal 105', and the RA circuit 122 again transitions to the auto-zero mode.

In some embodiments, in phase 2 of the second iteration, the second SAR circuit 142 is still configured to convert the amplified residual voltage signal 111 into the digital signal 107 that corresponds to the LSB portion of the digital output signal 103. Once the first digital signal 105 and the second digital signal 107 are provided to the error correction circuit 162 (e.g., after phase 2 of the second iteration), the error correction circuit 162 is configured to perform error correction on the first and second digital signals 105 and 107, and then provide the digital output signal 103 based on the first and second digital signals 105 and 107 with error correction, if any.

As further shown in FIG. 1, the first SAR circuit 102 includes a fast analog-to-digital converter (FADC) 102A and a residue digital-to-analog converter (RDAC) 102B. In some embodiments, during a current iteration, the FADC 102A and RDAC 102B are configured to concurrently receive and sample an analog input signal (e.g., 101) in phase 1 of the current iteration. Then, in phase 2 of the current iteration, the FADC 102A is configured to perform an SAR technique on the analog input signal (e.g., 101) to provide a first digital signal (e.g., 105) and concurrently provide an SAR control signal 113 to the RDAC 102B such that the RDAC 102B can use the SAR control signal 113 to derive a residual voltage signal (e.g., 109) for the RA circuit 122 to amplify in phase 3 of the current iteration. Operations of the FADC 102A and RDAC 102B will be discussed in further detail below with respect to FIG. 6.

Figure 2A:
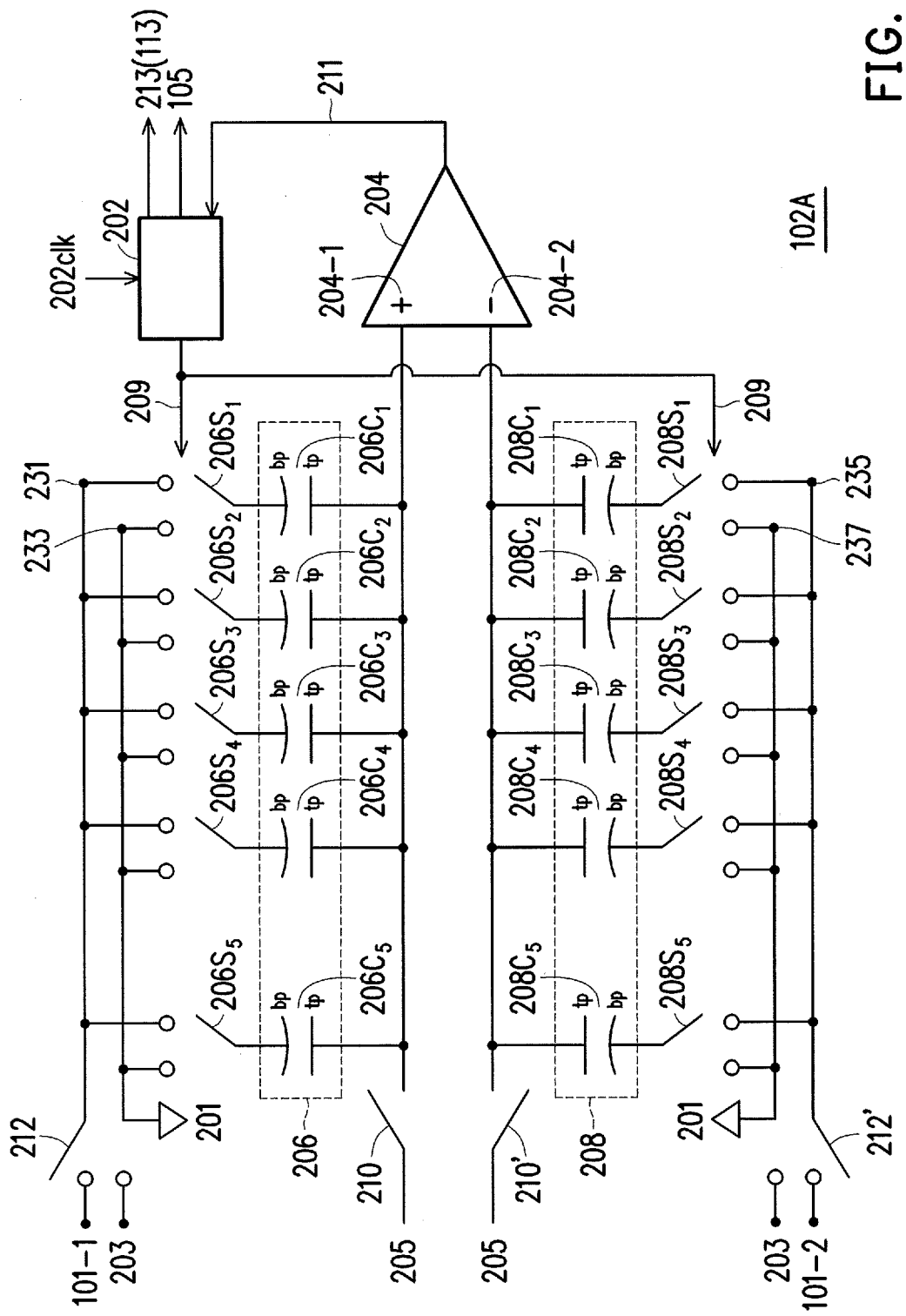
FIG. 2A illustrates an exemplary circuit diagram of a fast analog-to-digital converter (FADC) of a first successive approximation register (SAR) circuit of the hybrid ADC of FIG. 1, in accordance with some embodiments.
Figure 2B:
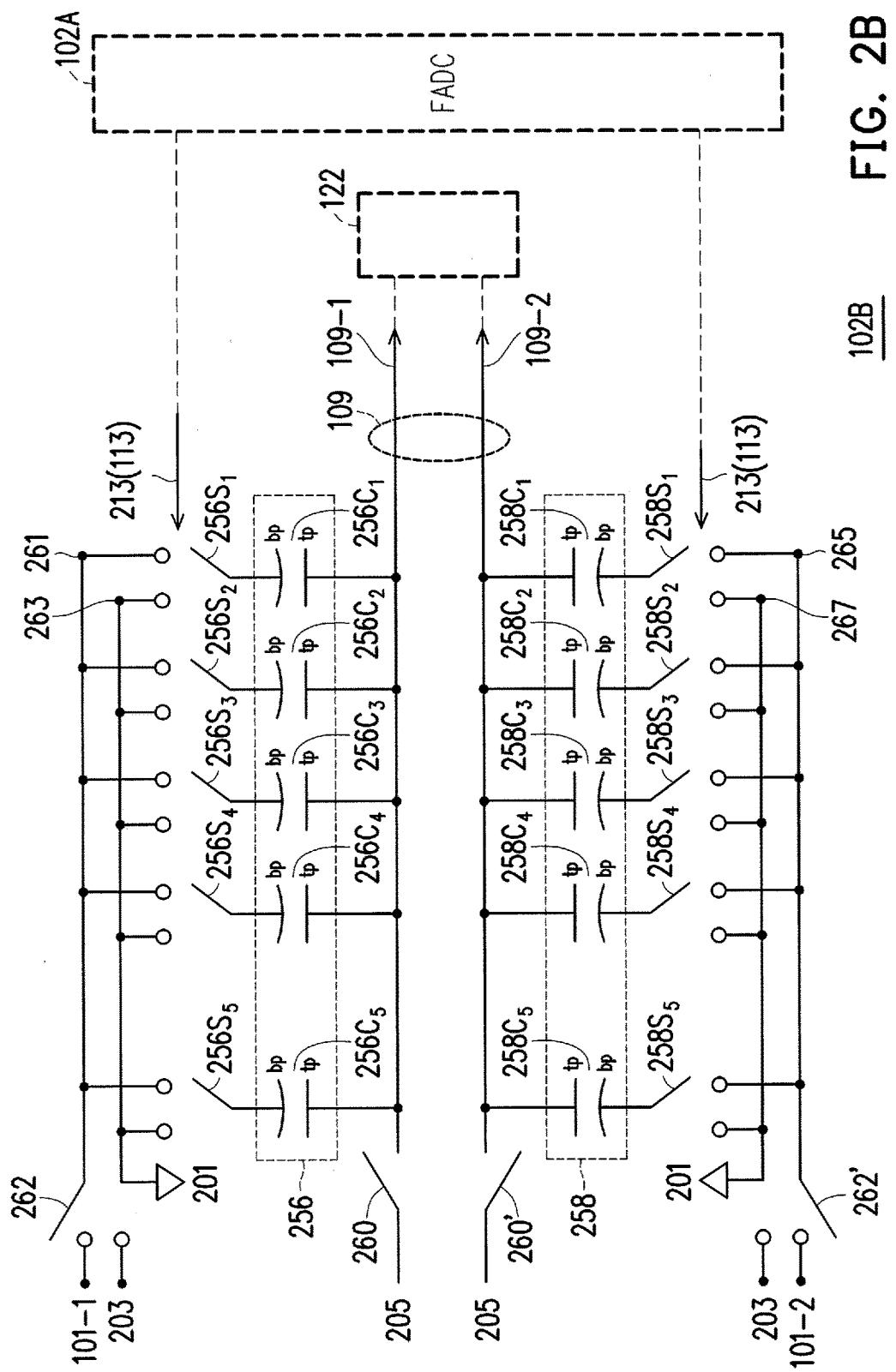
FIG. 2B illustrates an exemplary circuit diagram of a residue digital-to-analog converter (RDAC) the first SAR circuit of the hybrid ADC of FIG. 1, in accordance with some embodiments.

FIG. 2A illustrates an exemplary circuit diagram of the FADC 102A of the first SAR circuit 102, and FIG. 2B illustrates an exemplary circuit diagram of the RDAC 102B of the first SAR circuit 102, in accordance with some embodiments. Although in the illustrated embodiments of FIGS. 2A and 2B, the FADC 102A and the RDAC 102B are implemented as a fully-differential SAR ADC and a fully-differential SAR DAC (such an SAR ADC/DAC will be discussed in further detail below), respectively, it is noted that the FADC 102A and the RDAC 102B may be implemented by any of a variety of configurations for an SAR ADC and an SAR DAC, respectively, while remaining within the scope of the present disclosure. For example, the FADC 102A may include a single-ended SAR ADC, and the RDAC may include a single-ended SAR DAC.

Referring to FIG. 2A, the FADC 102A includes an SAR logic circuit 202, a comparator 204, a first capacitor array 206 that includes a plurality of capacitors $206C_1$, $206C_2$, $206C_3$, $206C_4$, and $206C_5$, a second capacitor array 208 that includes a plurality of capacitors $208C_1$, $208C_2$, $208C_3$, $208C_4$, and $208C_5$, bit switches $206S_1$, $206S_2$, $206S_3$, $206S_4$, $206S_5$, $208S_1$, $208S_2$, $208S_3$, $208S_4$, $208S_5$, and switches 210, 210', 212, and 212'. Each capacitor of the first and second capacitor arrays 206 and 208 is coupled to a respective bit switch at its respective conductive bottom plate (bp), which will be discussed below. As such, a number of the bit switches corresponds to a number of the first/second capacitor array (206/208). Although only five capacitors are shown in the first/second capacitor array (206/208), it is noted that any desired number of capacitors may be included in the first/second capacitor array (206/208), and a corresponding number of bit switches ($206S_1$ to $206S_5$, $208S_1$ to $208S_5$, etc.) may be included in the FADC 102A while remaining within the scope of the present disclosure.

In some embodiments, each capacitor of the first and second capacitor arrays 206 and 208 has a top conductive plate (tp) and a bottom conductive plate (bp), as shown in FIG. 2A. More specifically, the tp's of the capacitors $206C_1$, $206C_2$, $206C_3$, $206C_4$, and $206C_5$ are each coupled to a non-inverting input terminal 204-1 of the comparator 204, and also to a common voltage 205 (hereinafter "common voltage 205") through the switch 210 (when the switch 210 is turned on); and the bp's of the capacitors $206C_1$, $206C_2$, $206C_3$, $206C_4$, and $206C_5$ are each selectively coupled to either a node 231 or a node 233 based on a switching behavior of the respectively coupled bit switch ($206S_1$, $206S_2$, $206S_3$, $206S_4$, and $206S_5$). Further, in some embodiments, the node 231 is coupled to either an input voltage 101-1 (e.g., an in-phase signal of the analog input signal 101 of FIG. 1) or a reference voltage 203 (hereinafter "reference voltage 203") based on a switching behavior of the switch 212. And the node 233 is coupled to a reference voltage 201, e.g., ground, (hereinafter "ground 201").

For example, the bp of the capacitor $206C_1$ is selectively coupled to either the ground 201 via the node 233 or the node 231 based on the switching behavior of the bit switch $206S_1$, and the node 231 is selectively coupled to either the input voltage 101-1 or the reference voltage 203 based on the switching behavior of the switch 212; the bp of the capacitor $206C_2$ is selectively coupled to either the ground 201 (the node 233) or the node 231 based on the switching behavior of the bit switch $206S_2$, and the node 231 is selectively coupled to either the input voltage 101-1 or the reference voltage 203 based on the switching behavior of the switch 212; the bp of the capacitor $206C_3$ is selectively coupled to either the ground 201 (the node 233) or the node 231 based on the switching behavior of the bit switch $206S_3$, and the node 231 is selectively coupled to either the input voltage 101-1 or the reference voltage 203 based on the switching behavior of the switch 212; the bp of the capacitor $206C_4$ is selectively coupled to either the ground 201 (the node 233) or the node 231 based on the switching behavior of the bit switch $206S_4$, and the node 231 is selectively coupled to either the input voltage 101-1 or the reference voltage 203 based on the switching behavior of the switch 212; the bp of the capacitor $206C_5$ is selectively coupled to either the ground 201 (the node 233) or the node 231 based on the switching behavior of the bit switch $206S_5$, and the node 231 is selectively coupled to either the input voltage 101-1 or the reference voltage 203 based on the switching behavior of the switch 212.

Similarly, the tp's of the capacitors $208C_1$, $208C_2$, $208C_3$, $208C_4$, and $208C_5$ are each coupled to an inverting input terminal 204-2 of the comparator 204, and also to the common voltage 205 through the switch 210' (when the switch 210' is turned on); and the bp's of the capacitors $208C_1$, $208C_2$, $208C_3$, $208C_4$, and $208C_5$ are each selectively coupled to either a node 235 or a node 237 based on a switching behavior of the respectively coupled bit switch ($208S_1$, $208S_2$, $208S_3$, $208S_4$, or $208S_5$). Further, in some embodiments, the node 235 is coupled to either an input voltage 101-2 (e.g., an out-of-phase signal of the analog input signal 101 of FIG. 1) or the reference voltage 203 based on a switching behavior of the switch 212'. And the node 237 is coupled to the ground 201.

For example, the bp of the capacitor $208C_1$ is selectively coupled to either the ground 201 (the node 237) or the node 235 based on the switching behavior of the bit switch $208S_1$, and the node 235 is selectively coupled to either the input voltage 101-2 or the reference voltage 203 based on the switching behavior of the switch 212'; the bp of the capacitor $208C_2$ is selectively coupled to either the ground 201 (the node 237) or the node 235 based on the switching behavior of the bit switch $208S_2$, and the node 235 is selectively coupled to either the input voltage 101-2 or the reference voltage 203 based on the switching behavior of the switch 212'; the bp of the capacitor $208C_3$ is selectively coupled to either the ground 201 (the node 237) or the node 235 based on the switching behavior of the bit switch $208S_3$, and the node 235 is selectively coupled to either the input voltage 101-2 or the reference voltage 203 based on the switching behavior of the switch 212'; the bp of the capacitor $208C_4$ is selectively coupled to either the ground 201 (the node 237) or the node 235 based on the switching behavior of the bit switch $208S_4$, and the node 235 is selectively coupled to either the input voltage 101-2 or the reference voltage 203 based on the switching behavior of the switch 212'; the bp of the capacitor $208C_5$ is selectively coupled to either the ground 201 (the node 237) or the node 235 based on the switching behavior of the bit switch $208S_5$, and the node 235 is selectively coupled to either the input voltage 101-2 or the reference voltage 203 based on the switching behavior of the switch 212'.

In some embodiments, capacitances of the capacitors $206C_2$, $206C_3$, $206C_4$, and $206C_5$ of the first capacitor array 206 are weighted with respect to one another, and a capacitance of the capacitor $206C_1$ is selected to be equal to a minimum capacitance of the capacitors $206C_2$, $206C_3$, $206C_4$, and $206C_5$. For example, the capacitor $206C_2$ has a capacitance of c1 (i.e., $2^0 \times c1$); the capacitor $206C_3$ has a capacitance of 2c1 (i.e., $2^1 \times c1$); the capacitor $206C_4$ has a capacitance of 4c1 (i.e., $2^2 \times c1$); the capacitor $206C_5$ has a capacitance of 8c1 (i.e., $2^3 \times c1$), and the capacitor $206C_1$ has a capacitance of c1 When the first capacitor array 206 includes additional capacitors, a respective capacitance of each additional capacitor may be selected as: $2^N \times c1$, wherein N is an integer larger than 3. Capacitances of the capacitors $208C_1$, $208C_2$, $208C_3$, $208C_4$, and $208C_5$ of the second capacitor array 208 may be selected in similar fashion. For example, the capacitor $208C_2$ has a capacitance of c1 (i.e., $2^0 \times c1$); the capacitor $208C_3$ has a capacitance of 2c1 (i.e., $2^1 \times c1$); the capacitor $208C_4$ has a capacitance of 4c1 (i.e., $2^2 \times c1$); the capacitor $208C_5$ has a capacitance of 8c1 (i.e., $2^3 \times c1$), and the capacitor $208C_1$ has a capacitance of c1. Accordingly, the capacitance of each capacitor $206C_2$ to $206C_5$ (or $208C_2$ to $208C_5$) is a different fraction of a total capacitance of the capacitors $206C_1$ to $206C_5$ (or $208C_1$ to $208C_5$), i.e., c1+c1+2c1+4c1+8c1=16c1. In some embodiments, the total capacitance 16c1 of the capacitors $206C_1$ to $206C_5$ (or $208C_1$ to $208C_5$) is about 55 femtofarad (lF).

In some embodiments, the switching behavior of each of the bit switches ($206S_1$ to $206S_5$ and $208S_1$ to $208S_5$) is controlled by an SAR control signal 209 provided by the SAR logic circuit 202, and the switching behavior of each of the switches 210, 210', 212, and 212' is determined according to an operation mode of the FADC 102A, which may be determined by the control logic circuit 182 (FIG. 1). In general, the SAR logic circuit 202 is configured to sequentially provide a plurality of SAR control signals 209 based on a plurality of sequentially provided comparison results 211 that are output by the comparator 204. In some embodiments, the sequential provisions of the SAR control signals 209 may be provided based on a clock signal 202clk received by the SAR logic circuit 202. Each of the SAR control signals 209 may include information regarding how each of the bit switches ($206S_1$ to $206S_5$ and $208S_1$ to $208S_5$) is toggled, e.g., the bit switches ($206S_1$ to $206S_5$) to couple the respective bp of the capacitor to either the node 231 or 233, the bit switches ($208S_1$ to $208S_5$) to couple the respective bp of the capacitor to either the node 235 or 237, etc. Thus, it can be understood by people of ordinary skill in the art that the SAR control signal 209 may include a plurality of pulse signals that each oscillates between a logical 1 and a logical 0. The comparator 204, outputting the comparison result 211, is configured to compare voltage levels at its two input terminals 204-1 and 204-2 after each SAR control signal 209 is used for toggling the respective bit switches ($206S_1$ to $206S_5$ and $208S_1$ to $208S_5$). In some embodiments, after performing one or more times of iterations of such toggling on the bit switches ($206S_1$ to $206S_5$ and $208S_1$ to $208S_5$) until a last bit of the first digital signal 105 (FIG. 1) is determined, the SAR logic circuit 202 of the FADC 102A may output the first digital signal 105, which represents the MSB portion of the digital output signal 103 (FIG. 1). Operations of the FADC 102A will be described in further detail below with respect to FIG. 6.

Referring now to FIG. 2B, the RDAC 102B, coupled to the FADC 102A, is shown. In accordance with some embodiments, the RDAC 102B includes a first capacitor array 256 the includes a plurality of capacitors $256C_1$, $256C_2$, $256C_3$, $256C_4$, and $256C_5$, a second capacitor array 258 the includes a plurality of capacitors $258C_1$, $258C_2$, $258C_3$, $258C_4$, and $258C_5$, bit switches $256S_1$, $256S_2$, $256S_3$, $256S_4$, $256S_5$, $258S_1$, $258S_2$, $258S_3$, $258S_4$, $258S_5$, and switches 260, 260', 262, and 262'. In some embodiments, the RDAC 102B is substantially similar to the FADC 102A except that the RDAC 102B does not have an SAR logic circuit (e.g., 202) and a comparator (e.g., 204). Thus, the components of the RDAC 102B ($256C_1$ to $256C_5$, $258C_1$ to $258C_5$, $256S_1$ to $256S_5$, and $258S_1$ to $258S_5$) will be briefly described as follows.

Similarly, each capacitor of the first and second capacitor arrays 256 and 258 has a top conductive plate (tp) and a bottom conductive plate (bp), as shown in FIG. 2B. The tp's of the capacitors $256C_1$, $256C_2$, $256C_3$, $256C_4$, and $256C_5$ are each coupled to the common voltage 205 through the switch 260 (when the switch 260 is turned on); and the bp's of the capacitors $256C_1$, $256C_2$, $256C_3$, $256C_4$, and $256C_5$ are each selectively coupled to either a node 261 or a node 263 based on a switching behavior of the respectively coupled bit switch ($256S_1$, $256S_2$, $256S_3$, $256S_4$, or $256S_5$). Further, in some embodiments, the node 261 is coupled to either the input voltage 101-1 (e.g., the analog input signal 101/101' of FIG. 1) or the reference voltage 203 based on a switching behavior of the switch 262. And the node 233 is coupled to the ground 201.

Similarly, the tp's of the capacitors $258C_1$, $258C_2$, $258C_3$, $258C_4$, and $258C_5$ are each coupled to the common voltage 205 through the switch 260' (when the switch 260' is turned on); and the bp's of the capacitors $258C_1$, $258C_2$, $258C_3$, $258C_4$, and $258C_5$ are each selectively coupled to either a node 265 or a node 267 based on a switching behavior of the respectively coupled bit switch ($258S_1$, $258S_2$, $258S_3$, $258S_4$, or $258S_5$). Further, in some embodiments, the node 265 is coupled to either the input voltage 101-2 (e.g., an out-of-phase signal of the analog input signal 101/101' of FIG. 1) or the reference voltage 203 based on a switching behavior of the switch 262'. And the node 267 is coupled to the ground 201.

Still similarly, in some embodiments, capacitances of the capacitors $256C_2$, $256C_3$, $256C_4$, and $256C_5$ of the first capacitor array 256 are weighted with respect to one another, and a capacitance of the capacitor $256C_1$ is selected to be equal to a minimum capacitance of the capacitors $256C_2$, $256C_3$, $256C_4$, and $256C_5$. For example, the capacitor $256C_2$ has a capacitance of c2 (i.e., $2^0 \times c2$); the capacitor $256C_3$ has a capacitance of 2c2 (i.e., $2^1 \times c2$); the capacitor $256C_4$ has a capacitance of 4c2 (i.e., $2^2 \times c2$); the capacitor $256C_5$ has a capacitance of 8c2 (i.e., $2^3 \times c2$), and the capacitor $256C_1$ has a capacitance of c2. When the first capacitor array 256 includes additional capacitors, a respective capacitance of each additional capacitor may be selected as: $2^N \times c2$, wherein N is an integer larger than 3. Capacitances of the capacitors $258C_1$, $258C_2$, $258C_3$, $258C_4$, and $258C_5$ of the second capacitor array 258 may be selected in similar fashion. For example, the capacitor $258C_2$ has a capacitance of c2 (i.e., $2^0 \times c2$); the capacitor $258C_3$ has a capacitance of 2c2 (i.e., $2^1 \times c2$); the capacitor $258C_4$ has a capacitance of 4c2 (i.e., $2^2 \times c2$); the capacitor $258C_5$ has a capacitance of 8c2 (i.e., $2^3 \times c2$), and the capacitor $258C_1$ has a capacitance of c2. Accordingly, the capacitance of each capacitor $256C_2$ to $256C_5$ (or $258C_2$ to $258C_5$) is a different fraction of a total capacitance of the capacitors $256C_1$ to $256C_5$ (or $258C_1$ to $258C_5$), i.e., c2+c2+2c2+4c2+8c2=16c2. In some embodiments, the total capacitance 16c2 of the capacitors $256C_1$ to $256C_5$ (or $258C_1$ to $258C_5$) is about 2.6 picofarad (pF), which is substantially larger than the total capacitance (55 fF) of the capacitors $206C_1$ to $206C_5$ (or $208C_1$ to $208C_5$) of the FADC 102A.

In some embodiments, the switching behavior of each of the bit switches ($256S_1$ to $256S_5$ and $258S_1$ to $258S_5$) is controlled by an SAR control signal 213 also provided by the SAR logic circuit 202 of the FADC 102A (also shown in FIG. 2A), wherein the SAR control signal 213 corresponds to the SAR control signal 113 of FIG. 1. And the switching behavior of each of the switches 260, 260', 262, and 262' is concurrently determined according to the operation mode of the FADC 102A, which may be determined by the control logic circuit 182 (FIG. 1). More specifically, the switches 260/260' may be concurrently turned on or off with the switches 210/210' (FIG. 2A), and the switches 262/262' may be concurrently coupled to either the input voltage 101-1/101-2 or the reference voltage 203 with the switches 212/212' (FIG. 2A). Every time each SAR control signal 209 (FIG. 2A) updates toggling information for the bit switches ($206S_1$ to $206S_5$ and $208S_1$ to $208S_5$), the SAR control signal 213 may reflect such an update accordingly. In a non-limiting example, the SAR control signal 213 may be logically complementary to the SAR control signal 209. As such, when the MSB portion (e.g., the first digital signal 105) of the digital output signal 103 is provided by the FADC 102A, concurrently, the RDAC 102B can provide the residual voltage signal 109 to the RA circuit 122 of the hybrid ADC 100. Further, similar to the analog input signal 101 (comprising 101-1 and 101-2), the residual voltage signal 109 may be provided, by the RDAC 102B, as differential signals 109-1 (in-phase) and 109-2 (out-of-phase), hereinafter "differential residual signals 109-1 and 109-2." Operations of the RDAC 102B will be described in further detail below with respect to FIG. 6.

Figure 3A:
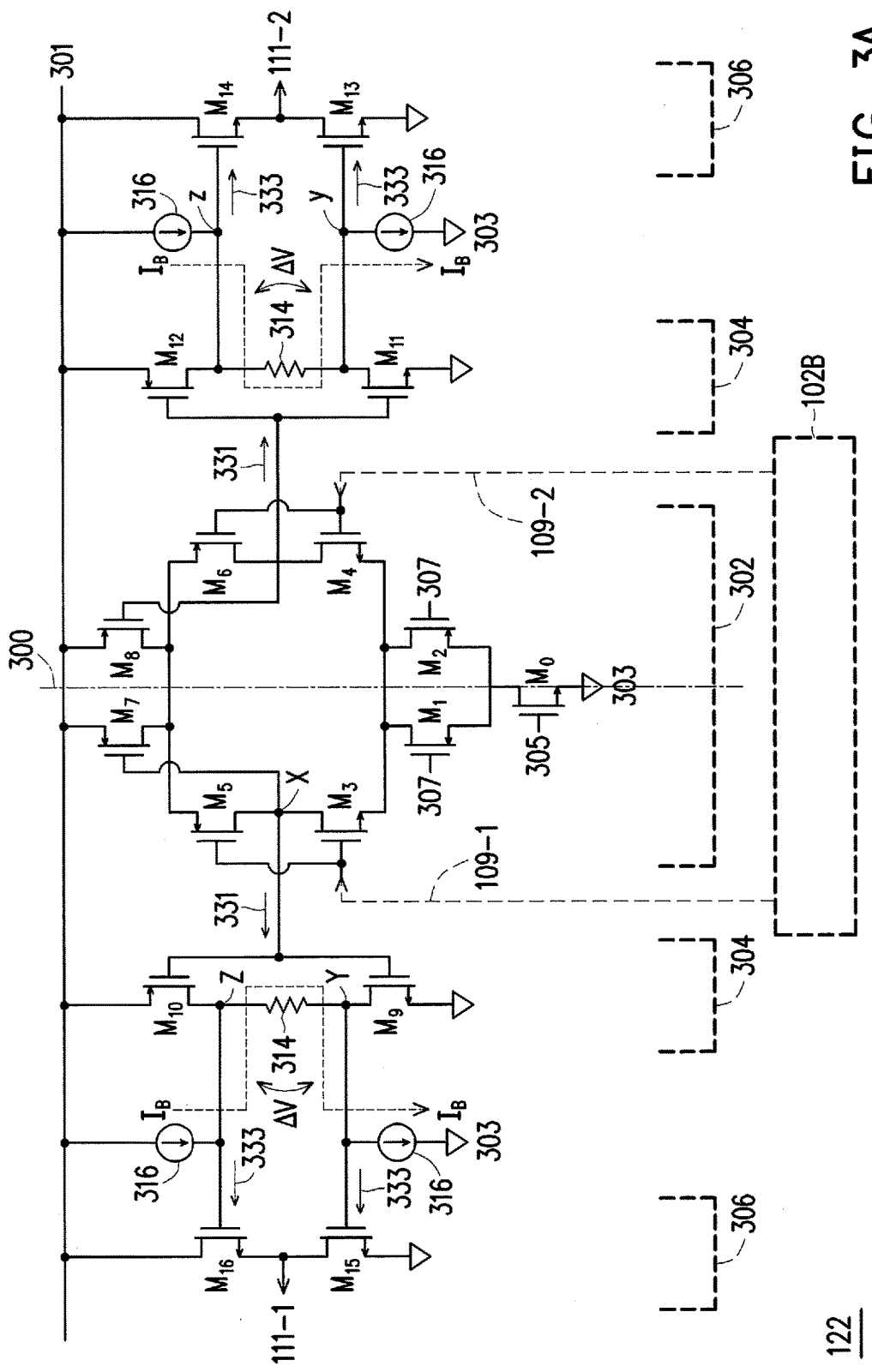
FIG. 3A illustrates an exemplary circuit diagram of a residue amplifier (RA) circuit of the hybrid ADC of FIG. 1, in accordance with some embodiments.

Referring to FIG. 3A, an exemplary circuit diagram of the RA circuit 122 (FIG. 1) is illustrated. In some embodiments, the RA circuit 122 includes three stages of circuits: 302, 304, and 306 that are configured to receive and amplify the differential residual signals 109-1 and 109-2. Accordingly, the exemplary circuit diagram of the RA circuit 122 is implemented as a differential amplifier, and, in FIG. 3A, shown as symmetric with respect to line 300.

More specifically, the first stage 302 at left and right sides with respect to the line 300 are configured to receive the differential residual signals 109-1 and 109-2, respectively, the second stage 304 at the left and right sides with respect to the line 300 are configured to receive and process signals (e.g., 331) from the respective sides of the first stage 302, and the third stage 306 at the left and right sides with respect to the line 300 are configured to receive and process signals (e.g., 333) from the respective sides of the second stage 304. It is noted that the RA circuit 122 may be alternatively implemented as a single-ended amplifier while remaining within the scope of the present disclosure.

In some embodiments, the first stage 302 includes transistors M0, M1, M2, M3, M4, M5, M6, M7, and M8; the second stage 304 includes transistors M9, M10, M11, M12, and two resistors 314 coupled between the transistors (M9 and M10) and (M11 and M12), respectively; the third stage 306 includes transistors M13, M14, M15, and M16. Further, the RA circuit 122 includes two pairs of current sources 316 that are each coupled between the second stage 304 and the third stage 306 at the left and right sides of the line 300, respectively. The transistors M0, M1, M2, M3, M4, M9, M11, M13, and M15 each includes an NMOS transistor, and M5, M6, M7, M8, M10, M12, M14, and M16 each includes a PMOS transistor. Although the illustrated embodiments of FIG. 3A shows that M0-M16 are either NMOS or PMOS transistors, any of a variety of transistors or devices that are suitable for use in a memory device may be implemented as at least one of M0-M16 such as, for example, a bipolar junction transistor (BJT), a high-electron-mobility transistor (HEMT), etc. As mentioned above, the RA circuit 122 is symmetric with respect to the line 300 so that, for brevity, the following discussion of the RA circuit 122 will be focused on the left side of the line 300.

More specifically in the illustrated embodiment of FIG. 3A, on the left side of the line 300, in the first stage 302, the transistor M0, which is also shared by the right side of the line 300, is gated by an enable signal 305 and coupled to reference voltage 303 (e.g. ground) at its source; the transistor M1 is gated by a bias signal 307 and coupled to the transistor M0 at the transistor M0's drain and M1's source; transistors M3 and M5 are formed as a first inverter, between Vdd 301 and ground 303, that receives one of the differential residual signal 109-1 as an input signal; the transistor M7 is coupled to reference voltage 301 (e.g., Vdd) at its source, and the transistor M7's gate is coupled to a common node "X" coupled to the transistor M3's and M5's respective drains. In the second stage 304, the transistors M9 and M10 are coupled to the common node X at their respective gates, and the transistors M9 and M10 are formed as a second inverter, between Vdd 301 and ground 303, that receives a voltage signal at the node X as an input signal; and the resistor 314 is coupled between the transistors M9 and M10 at their respective drains, i.e., nodes "Y" and "Z." In the third stage 306, the transistors M15 and M16 are formed as a third inverter between Vdd 301 and ground 303, wherein the transistor M15's gate is coupled to the node Y and the transistor M16's gate is coupled to the node Z. And the third inverter formed by the transistors M15 and M16 is configured to output signal 111-1 that is an amplified version of the signal 109-1. In some embodiments, the amplified signal 111-1 may correspond to an in-phase signal of the amplified residual voltage signal 111 (FIG. 1), which will be discussed in further detail below. Between the second and third stages 304 and 306, one of the pair of the current sources 316 is coupled between Vdd 301 and the node Z, and the other of the pair of the current sources 316 is coupled between the node Y and ground 303.

On the right side of the line 300, the transistors M0, M2, M4, M6, M8, M11, M12, M13, and M14, the resistor 314, and the pair of current sources 316 are laid out substantially similar to the components on the left side except that an inverter formed by the transistors M4 and M6 receives the other of the differential residual signal 109-2 as its input signal, and another inverter formed by the transistors M13 and M14 is configured to output signal 111-2 that is an amplified version of the signal 109-2. It is also noted that between the second and third stages 304 and 306, one of the pair of the current sources 316 is coupled between Vdd 301 and node "z," and the other of the pair of the current sources 316 is coupled between node "y" and ground 303. In some embodiments, the amplified signal 111-2 may correspond to an out-of-phase signal of the amplified residual voltage signal 111 (FIG. 1).

Figure 3B:
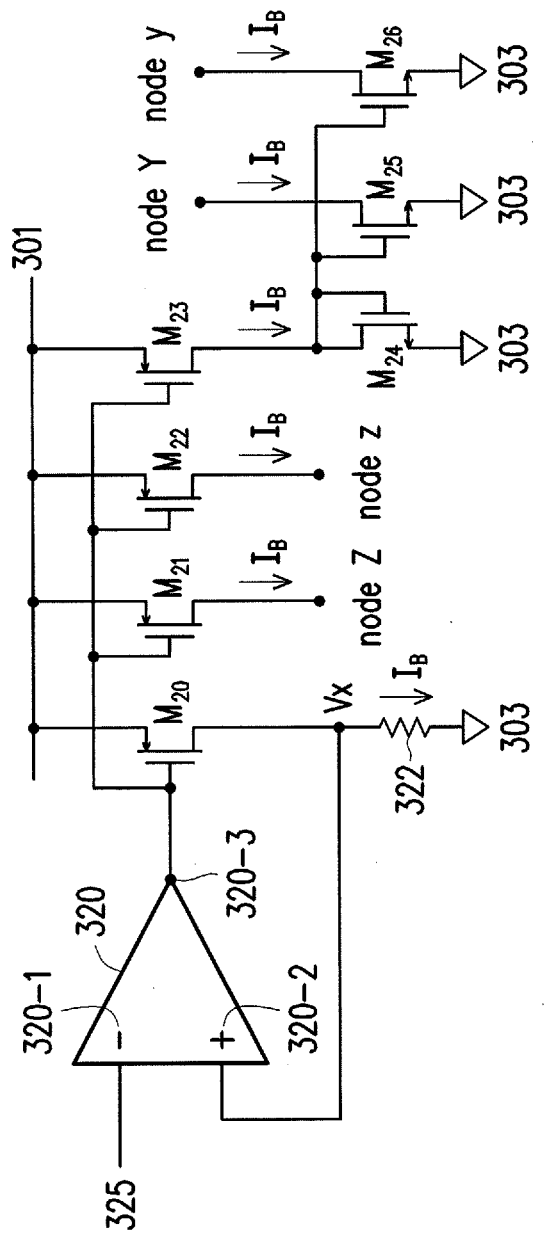
FIG. 3B illustrates an exemplary circuit diagram of a current source of the RA circuit of FIG. 3A, in accordance with some embodiments.

FIG. 3B illustrates an exemplary circuit diagram of the current sources 316. In accordance with some embodiments, the four current sources 316 of FIG. 3A may be implemented as a single circuit shown in FIG. 3B. As shown, the current source 316 includes transistors M20, M21, M22, M23, M24, M25, and M26, an amplifier 320, and a resistor 322. The transistors M24, M25, and M26 each includes an NMOS transistor, and M20, M21, M22, and M23 each includes a PMOS transistor, in accordance with some embodiments. Although the illustrated embodiments of FIG. 3B shows that M20-M26 are either NMOS or PMOS transistors, any of a variety of transistors or devices that are suitable for use in a memory device may be implemented as at least one of M20-M26 such as, for example, a bipolar junction transistor (BJT), a high-electron-mobility transistor (HEMT), etc.

More specifically in the illustrated embodiment of FIG. 3B, the amplifier 320 includes an inverting input terminal 320-1, a non-inverting input terminal 320-2, and an output terminal 320-3; the transistor M20's source is coupled to Vdd 301, the transistor M20's gate is coupled to the output terminal 320-3, and the transistor M20' drain is coupled to the non-inverting input terminal 320-2 and ground 303 through the resistor 322; the transistor M21's source is coupled to Vdd 301, the transistor M21's gate is also coupled to the output terminal 320-3, and the transistor M21' drain is coupled to node Z of the RA circuit 122 (FIG. 3A); the transistor M22's source is coupled to Vdd 301, the transistor M22's gate is also coupled to the output terminal 320-3, and the transistor M22' drain is coupled to node z of the RA circuit 122 (FIG. 3A); the transistor M23's source is coupled to Vdd 301, the transistor M23's gate is also coupled to the output terminal 320-3, and the transistor M23' drain is commonly coupled to drains of the transistors M24 and M25 and gates of the transistors M24-M26. The transistors M24-M26 are coupled to ground 303 at their respective sources. Further, in some embodiments, drains of the transistors M25 and M26 are coupled to nodes Y and y (FIG. 3A), respectively. Operations of the RA circuit 122 will be described below with respect to FIG. 6.

In some embodiments, a resistance value ($R_B$) of the resistor 322 is selected to be substantially identical to a resistance value of the resistor 314 of FIG. 3A, and the resistor 322 is coupled between the non-inverting input terminal 320-2 of the amplifier 320 and ground 303. As such, the current source 316 can provide a process-tracking current $I_B$ (FIGS. 3A and 3B) flowing across the resistor 314, which causes a voltage drop ($\Delta V$) across the resistor 314 to be independent of process and temperature variations that are induced by the resistor 314. Moreover, operation modes of the transistors (M13 and M14) and (M15 and M16) are determined based on the voltage drop $\Delta V$. By selecting the voltage drop $\Delta V$ using a pre-determined reference voltage (which will be discussed in further detail below), the transistors M13-M16 at the third stage 306 of the RA circuit 122 can each be assured to operate under a sub-threshold mode, which provides the RA circuit 122 with a high output resistance.

More specifically, in some embodiments, the inverting input terminal 320-1 of the amplifier 320 is coupled to a reference voltage (Vref) 325. In a steady-state, when the transistor M20 is turned on, a voltage level (Vx) at drain of the transistor M20 is substantially similar to Vref 325. Accordingly, the process-tracking current $I_B$ is generated to flow through the turned-on transistor M20 and the resistor 322, wherein a current level of $I_B$ is determined based on: Vref/$R_B$. By connecting the transistors M21-M26 as shown in the illustrated embodiment of FIG. 3B, the transistors M21-M26 may serve as plural current mirrors. Alternatively stated, once the transistors M20 is turned on, the transistors M21-M26 are turned on, and more particularly, the process-tracking current $I_B$ can be mirrored to each of the transistors M21-M26. As such, the process-tracking current $I_B$ can be provided to the nodes Z, z, Y, and y through the transistors M21, M22, M25, and M26, respectively.

Figure 4:
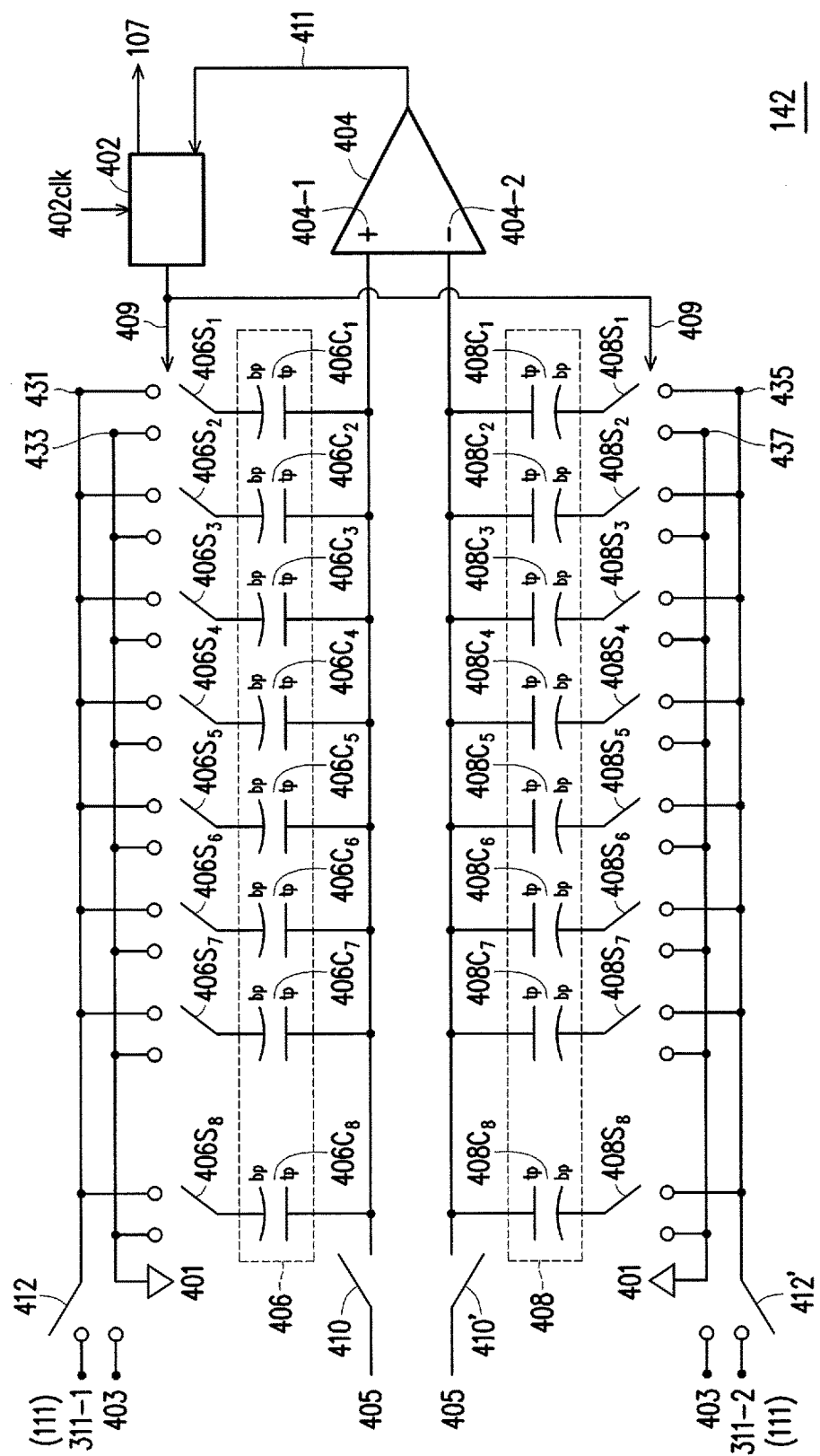
FIG. 4 illustrates an exemplary circuit diagram of a second SAR circuit of the hybrid ADC of FIG. 1, in accordance with some embodiments.

FIG. 4 illustrates an exemplary circuit diagram of the second SAR circuit 142 (FIG. 1), in accordance with some embodiments. The second SAR circuit 142 is substantially similar to the FADC 102A of the first SAR circuit 102 (FIG. 2A) so that, for purposes of clarity, the second SAR circuit 142 will be briefly described. As shown, the second SAR circuit also includes an SAR logic circuit 402, a comparator 404, a first capacitor array 406 the includes a plurality of capacitors $406C_1$, $406C_2$, $406C_3$, $406C_4$, $406C_5$, $406C_6$, $406C_7$, and $406C_8$, a second capacitor array 408 the includes a plurality of capacitors $408C_1$, $408C_2$, $408C_3$, $408C_4$, $408C_5$, $408C_6$, $408C_7$, and $408C_8$, bit switches $406S_1$, $406S_2$, $406S_3$, $406S_4$, $406S_5$, $406S_6$, $406S_7$, $406S_8$, $408S_1$, $408S_2$, $408S_3$, $408S_4$, $408S_5$, $408S_6$, $408S_7$, and $408S_8$, and switches 410, 410', 412, and 412'. Similarly, a number of the bit switches corresponds to a number of the first/second capacitor array (406/408). Although only eight capacitors are shown in the first/second capacitor array (406/408), it is noted that any desired number of capacitors may be included in the first/second capacitor array (406/408), and a corresponding number of bit switches ($406S_1$ to $406S_8$, $408S_1$ to $408S_8$, etc.) may be included in the second SAR circuit 142 while remaining within the scope of the present disclosure.

In some embodiments, each capacitor of the first and second capacitor arrays 406 and 408 has a top conductive plate (tp) and a bottom conductive plate (bp), as shown in FIG. 4. More specifically, the tp's of the capacitors $406C_1$ to $406C_8$ are each coupled to a non-inverting input terminal 404-1 of the comparator 404, and also to a common voltage 405 (hereinafter "common voltage 405") through the switch 410 (when the switch 410 is turned on); and the bp's of the capacitors $406C_1$ to $406C_8$ are each selectively coupled to either a node 431 or a node 433 based on a switching behavior of the respectively coupled bit switch ($406S_1$ to $406S_8$). Further, in some embodiments, the node 431 is coupled to either an input voltage 111-1 (e.g., an in-phase signal of the amplified residual voltage signal 111 of FIG. 1) or a reference voltage 403 (hereinafter "reference voltage 403") based on a switching behavior of the switch 412. And the node 433 is coupled to a reference voltage 401, e.g., ground, (hereinafter "ground 401").

Similarly, the tp's of the capacitors $408C_1$ to $408C_8$ are each coupled to an inverting input terminal 404-2 of the comparator 404, and also to the common voltage 405 through the switch 410' (when the switch 410' is turned on); and the bp's of the capacitors $408C_1$ to $408C_8$ are each selectively coupled to either a node 435 or a node 437 based on a switching behavior of the respectively coupled bit switch ($408S_1$ to $408S_8$). Further, in some embodiments, the node 435 is coupled to either an input voltage 311-2 (e.g., an out-of-phase signal of the amplified residual voltage signal 111 of FIG. 1) or the reference voltage 403 based on a switching behavior of the switch 412'. And the node 437 is coupled to the ground 401.

In some embodiments, capacitances of the capacitors $406C_1$ to $406C_8$ of the first capacitor array 406 are weighted with respect to one another, and a capacitance of the capacitor $406C_1$ is selected to be equal to a minimum capacitance of the capacitors $406C_2$ to $406C_8$. For example, the capacitor $406C_2$ has a capacitance of c3 (i.e., $2^0 \times c3$); the capacitor $406C_3$ has a capacitance of 2c3 (i.e., $2^1 \times c3$); the capacitor $406C_4$ has a capacitance of 4c3 (i.e., $2^2 \times c3$); the capacitor $406C_5$ has a capacitance of 8c3 (i.e., $2^3 \times c3$); the capacitor $406C_6$ has a capacitance of 16c3 (i.e., $2^4 \times c3$); the capacitor $406C_7$ has a capacitance of 32c3 (i.e., $2^5 \times c3$); the capacitor $406C_8$ has a capacitance of 64c3 (i.e., $2^6 \times c3$), and the capacitor $406C_1$ has a capacitance of c3. When the first capacitor array 406 includes additional capacitors, a respective capacitance of each additional capacitor may be selected as: $2^N \times c1$, wherein N is an integer larger than 6. Capacitances of the capacitors $408C_1$ to $408C_8$ of the second capacitor array 408 may be selected in similar fashion. For example, the capacitor $408C_2$ has a capacitance of c3 (i.e., $2^0 \times c3$); the capacitor $408C_3$ has a capacitance of 2c3 (i.e., $2^1 \times c3$); the capacitor $408C_4$ has a capacitance of 4c3 (i.e., $2^2 \times c3$); the capacitor $408C_5$ has a capacitance of 8c3 (i.e., $2^3 \times c3$); the capacitor $408C_6$ has a capacitance of 16c3 (i.e., $2^4 \times c3$); the capacitor $408C_7$ has a capacitance of 32c3 (i.e., $2^5 \times c3$); the capacitor $408C_8$ has a capacitance of 64c3 (i.e., $2^6 \times c3$), and the capacitor $408C_1$ has a capacitance of c3. Accordingly, the capacitance of each capacitor $406C_2$ to $406C_8$ (or $408C_2$ to $408C_8$) is a different fraction of a total capacitance of the capacitors $406C_1$ to $406C_8$ (or $408C_1$ to $408C_8$), i.e., c3+c3+2c3+4c3+8c3+16c3+32c3=64c3. In some embodiments, the total capacitance 64 c3 of the capacitors $406C_1$ to $406C_8$ (or $408C_1$ to $408C_8$) is about 250 femtofarad (fF).

Similarly, in some embodiments, the switching behavior of each of the bit switches ($406S_1$ to $406S_8$ and $408S_1$ to $408S_8$) is controlled by an SAR control signal 409 provided by the SAR logic circuit 402, and the switching behavior of each of the switches 410, 410', 412, and 412' is determined according to an operation mode of the second SAR circuit 142, which may be determined by the control logic circuit 182 (FIG. 1). In general, the SAR logic circuit 402 is configured to sequentially provide a plurality of SAR control signals 409 based on a plurality of sequentially provided comparison results 411 that are output by the comparator 404. In some embodiments, the sequential provisions of the SAR control signals 409 may be provided based on a clock signal 402clk received by the SAR logic circuit 402. Each of the SAR control signals 409 may include information regarding how each of the bit switches ($406S_1$ to $406S_8$ and $408S_1$ to $408S_8$) is toggled. Thus, it can be understood by people of ordinary skill in the art that the SAR control signal 409 may include a plurality of pulse signals that each oscillates between a logical 1 and a logical 0. The comparator 404, outputting the comparison result 411, is configured to compare voltage levels at its two input terminals 404-1 and 404-2 after each SAR control signal 409 is used for toggling the respective bit switches ($406S_1$ to $406S_8$ and $408S_1$ to $408S_8$). In some embodiments, after performing one or more times of iterations of such toggling on the bit switches ($406S_1$ to $406S_8$ and $408S_1$ to $408S_8$) until a last bit of the second digital signal 107 (FIG. 1) is determined, the SAR logic circuit 402 of the second SAR circuit 142 may output the second digital signal 107, which is the LSB portion of the digital output signal 103 (FIG. 1). Operations of the second SAR circuit 142 will be described in further detail below with respect to FIG. 6.

Figure 5A:
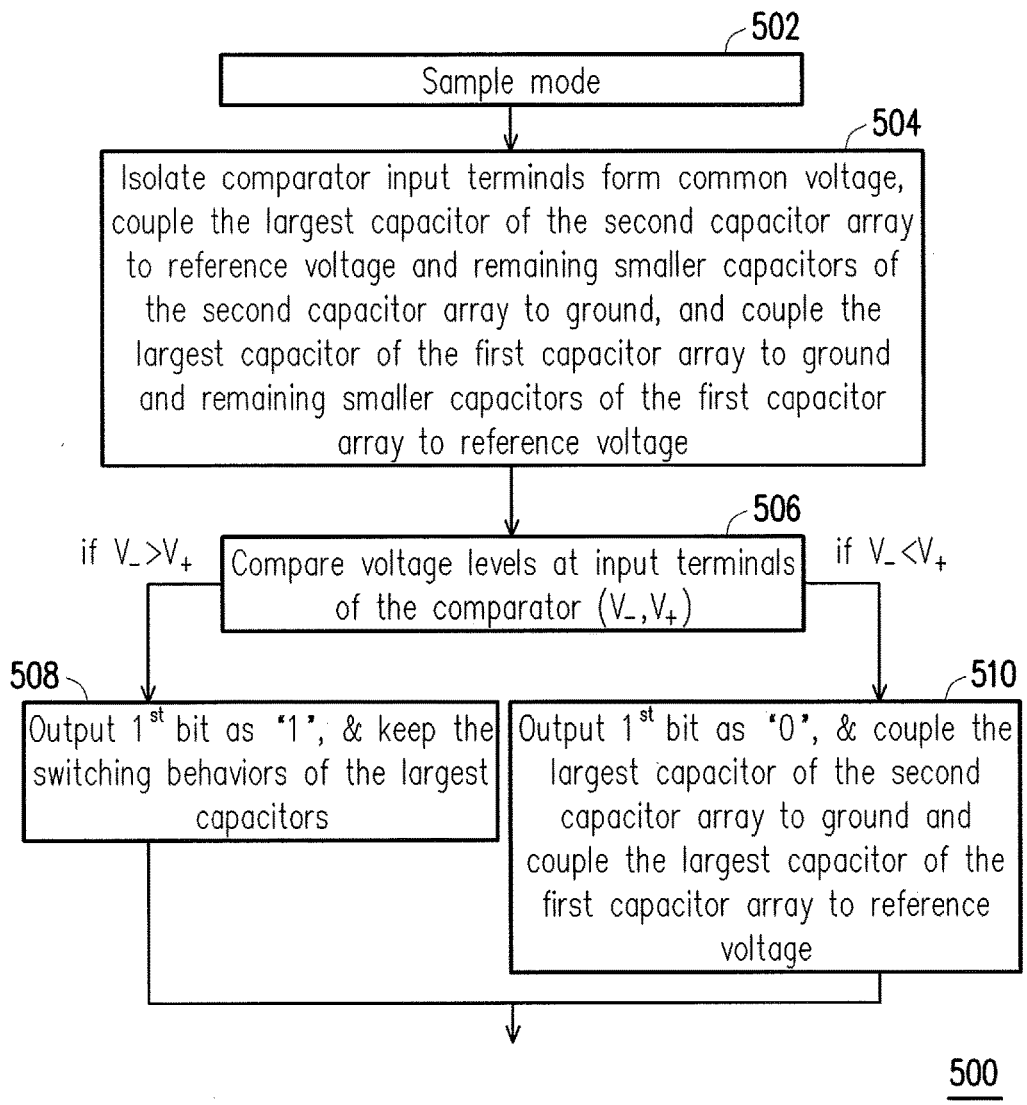
FIGS. 5A and 5B illustrate an exemplary flow chart of a method for performing an SAR technique, in accordance with some embodiments.

FIG. 5 illustrates an exemplary flow chart of a method 500 for performing an SAR (successive approximation register) technique to convert an analog signal to corresponding digital bits, in accordance with some embodiments. The illustrated embodiment of the method 500 is merely an example. Therefore, it should be understood that any of a variety of operations may be omitted, re-sequenced, and/or added while remaining within the scope of the present disclosure. In accordance with some embodiments, the operations of the method 500 can be performed by the FADC 102A of FIG. 2A, the RDAC 102B of FIG. 2B, or the second SAR circuit of FIG. 4, respectively. For ease of discussion, the following embodiment of the method 500 will be described using the FADC 102A of FIG. 2A as a representative example.

The method 500 starts with operation 502 in which the FADC 102A is in a sample mode to sample the received analog input signal 101, in accordance with some embodiments. Such a sample mode may be initiated by the control logic circuit 182 (FIG. 1).

As mentioned above, the FADC 102A is implemented as a fully-differential SAR ADC, so that the analog input signal 101 may be provided to the FADC 102A as differential signals, that is, the in-phase input voltage (e.g., 101-1) and the out-of-phase input voltage (e.g., 101-2). In the sample mode, the FADC 102A samples the analog input signal 101 (e.g., input voltages 101-1 and 101-2) by coupling the switch 212 to the input voltage 101-1 and the switch 212' to the input voltage 101-2, and turning on the switches 210 and 210'. Further, the SAR logic circuit 202 may use the SAR control signal 209 to cause the bp of each of the capacitors $206C_1$ to $206C_5$ to couple to the node 231 through the respective bit switches $206S_1$ to $206S_5$, and the bp of each of the capacitors $208C_1$ to $208C_5$ to couple to the node 235 through the respective bit switches $208S_1$ to $208S_5$. As such, the input terminals 204-1 and 204-2 of the comparator 204 are coupled to the common voltage 205, and the capacitors $206C_1$ to $206C_5$ and $208C_1$ to $208C_5$ are charged based on the differential input voltages 101-1 and 101-2.

After the FADC 102A samples the differential input voltages 101-1 and 101-2, the method 500 proceeds to operation 504, which is typically referred to as a hold mode of the FADC 102A, in accordance with some embodiments. The operation 504 includes the input terminals 204-1 and 204-2 of the comparator 204 are isolated from the common voltage 205, the bp of the capacitor of the second capacitor array 208 with the largest capacitance (e.g., $208C_5$) is coupled to the reference voltage 203, the bp's of the remaining capacitors (e.g., $208C_1$ to $208C_4$) of the second capacitor array 208 with smaller capacitances is coupled to ground 201, the bp of the capacitor of the first capacitor array 206 with the largest capacitance (e.g., $206C_5$) is coupled to the ground 201, and the bp's of the remaining capacitors (e.g., $206C_1$ to $206C_4$) of the first capacitor array 206 with smaller capacitances is coupled to reference voltage 203.

More specifically, in such a hold mode (e.g., operation 504), the switches 210 and 210' are turned off, which causes the input terminals 204-1 and 204-2 to be isolated from the common voltage 205, respectively. And the switches 212 and 212' are coupled to the reference voltages 203, respectively, so that voltage levels of the node 231 and 235 may be equal to the reference voltage 203. Further, in some embodiments, the SAR logic circuit 202 uses the SAR control signal 209 to keep the bit switch $208S_5$ coupled to the node 235, couple the bit switches $208S_1$ to $208S_4$ to the node 237, keep the bit switches $206S_1$ to $206S_4$ coupled to the node 231, and couple the bit switch $206S_5$ to the node 233. As such, the bp of the capacitor $208C_5$ (i.e., the capacitor in the second capacitor array 208 with the largest capacitance) is coupled to the reference voltage 203; the bp's of the capacitors $208C_1$ to $208C_4$ (i.e., the capacitors in the second capacitor array 208 with smaller capacitances) are coupled to ground 201; the bp of the capacitor $206C_5$ (i.e., the capacitor in the first capacitor array 206 with the largest capacitance) is coupled to ground 201; and the bp's of the capacitors 206C$_1$ to 206C$_4$ (i.e., the capacitors in the first capacitor array 206 with smaller capacitances) are coupled to the reference voltage 203.

The method 500 continues to operation 506 in which voltage levels at the input terminals 204-1 and 204-2 are compared, in accordance with some embodiments. More specifically, the comparator 204 compares the voltage levels present on the input terminals 204-1 and 204-2. If the voltage level at the inverting input terminal 204-2 is larger than the voltage level at the non-inverting input terminal 204-1, the method 500 proceeds to operation 508. On the other hand, if the voltage level at the inverting input terminal 204-2 is smaller than the voltage level at the non-inverting input terminal 204-1, the method 500 proceeds to operation 510. The operations 508 and 510 will be respectively discussed in further detail below.

More specifically, in some embodiments, in the operation 508 where the comparator 204 determines the voltage level at 204-2 is larger than the voltage level at 204-1, the comparator 204 outputs the comparison result 211 to the SAR logic circuit 202, and the SAR logic circuit 202 determines a first bit of the first digital signal 105 (the MSB portion of the digital output signal 103 of FIG. 1) as a logical 1. In some embodiments, when the first bit of the first digital signal 105 is determined as a logical 1, the switching behaviors of the bit switches 206S$_1$ to 206S$_5$ and 208S$_1$ to 208 S$_5$ may remain unchanged, and, more particularly, the switching behaviors of the bit switches 206S$_5$ and 208S$_5$ may be stored in the SAR logic circuit 202 for a later use.

In some embodiments, in the operation 510 where the comparator 204 determines the voltage level at 204-2 is smaller than the voltage level at 204-1, the comparator 204 outputs the comparison result 211 to the SAR logic circuit 202, and the SAR logic circuit 202 determines output the first bit of the first digital signal 105 as a logical 0. Simultaneously or subsequently, the SAR logic circuit 202 updates the SAR control signal 209 to change the switching behavior of the bit switches 206S$_5$ and 208S$_5$. That is, the bp of the capacitor 208C$_5$ is coupled to ground 201 through the bit switch 208S$_5$, and the bp of the capacitor 206C$_5$ is coupled to the reference voltage 203 through the bit switch 206S$_5$. Similarly, the switching behaviors of the bit switches 206S$_5$ and 208S$_5$ may be stored in the SAR logic circuit 202 for a later use.

Figure 5B:
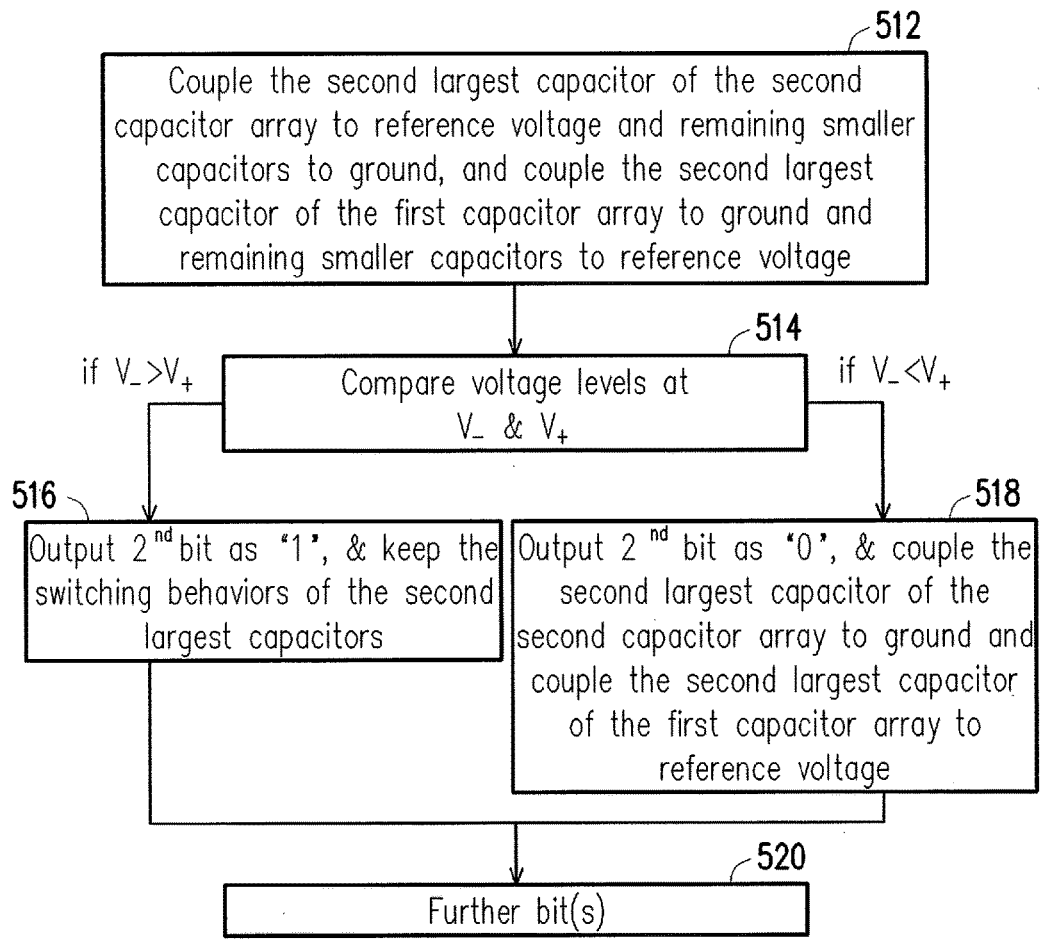

After the first bit of the first digital signal 105 is determined, the method 500 continues to subsequent operations that are substantially similar to the operations from 504 to 508 or 510 to determine remaining bits of the first digital signal 105. For clarity, the embodiment of the method 500, as shown in FIG. 5B, only includes operations 512, 514, 516, and 518 to determine a second bit of the first digital signal 105 while subsequent operations to determine further bits of the first digital signal 105 are collectively described as operation 520.

The method continues to operation 512 in which the input terminals 204-1 and 204-2 are still isolated from the common voltage 205, the bp of the capacitor of the second capacitor array 208 with the second largest capacitance (e.g., 208C$_4$) is coupled to the reference voltage 203, the bp's of the remaining capacitors (e.g., 208C$_1$ to 208C$_3$) of the second capacitor array 208 with smaller capacitances is coupled to ground 201, the bp of the capacitor of the first capacitor array 206 with the second largest capacitance (e.g., 206C$_4$) is coupled to the ground 201, and the bp's of the remaining capacitors (e.g., 206C$_1$ to 206C$_3$) of the first capacitor array 206 with smaller capacitances is coupled to reference voltage 203, in accordance with some embodiments.

More specifically, in some embodiments, the SAR logic circuit 202 updates the SAR control signal 209 to remain the switching behaviors of the bit switch 208S$_5$ and 206S$_5$ that are determined in either the operation 508 or 510, couple the bit switch 208S$_4$ to the node 235, remain the bit switches 208S1 to 208S$_3$ being coupled to the node 237, couple the bit switches 206S$_4$ to the node 233, and remain the bit switches 206S$_1$ to 206S$_4$ being coupled to the node 231. As such, the bp of the capacitor 208C$_4$ (i.e., the capacitor in the second capacitor array 208 with the second largest capacitance) is coupled to the reference voltage 203; the bp's of the capacitors 208C$_1$ to 208C$_3$ (i.e., the capacitor in the second capacitor array 208 with smaller capacitances) are coupled to ground 201; the bp of the capacitor 206C$_4$ (i.e., the capacitor in the first capacitor array 206 with the second largest capacitance) is coupled to ground 201; and the bp's of the capacitors 206C$_1$ to 206C$_3$ (i.e., the capacitor in the first capacitor array 206 with smaller capacitances) are coupled to the reference voltage 203.

The method 500 continues to operation 514 in which voltage levels at the input terminals 204-1 and 204-2 are compared, in accordance with some embodiments. If the voltage level at the inverting input terminal 204-2 is larger than the voltage level at the non-inverting input terminal 204-1, the method 500 proceeds to operation 516 in which the SAR logic circuit 202 determines that the second bit of the first digital signal 105 as a logical 1 and keep the switching behaviors of the bit switches 206S$_4$ and 208S$_4$ (i.e., the bit switch 208S$_4$ being coupled to the node 235 and the bit switch 206S$_4$ being coupled to the node 233). On the other hand, if the voltage level at the inverting input terminal 204-2 is smaller than the voltage level at the non-inverting input terminal 204-1, the method 500 proceeds to operation 518 in which the SAR logic circuit 202 determines that the second bit of the first digital signal 105 as a logical 0 and change the switching behaviors of the bit switches 206S$_4$ and 208S$_4$ such that the bp of the capacitor 208C$_4$ is coupled to the node 237 (the ground 201) and the bp of the capacitor 206C$_4$ is coupled to the node 231 (the reference voltage 203). Similarly, the switching behaviors of the bit switches 206S$_4$ and 208S$_4$ may be stored in the SAR logic circuit 202 for a later use.

Following the above-discussed operations of 504-510 to determine the logical state of the first bit of the first digital signal 105 and 512-518 to determine the logical state of the second bit of the first digital signal 105, a logical state of each subsequent bit of the first digital signal 105 may be determined by the SAR logic circuit 202. For example, the method 500 proceeds to operation 520 for performing another iteration of the operations 504-510/512-518 to determine whether a third bit of the first digital signal 105 is a logical 1 or 0. In some embodiments, a number of bits of the first digital signal 105 corresponds to the number of capacitors in the capacitor array 206/208 minus 1. In the illustrated embodiment of FIG. 2A, the number of bits of the first digital signal 105, provided by the FADC 102A, may be 4 (i.e., 5–1).

As mentioned above, the SAR technique (i.e., the method 500) can also be used by the RDAC 102B and the second SAR circuit 142, respectively, to provide respective outputs. Referring again to FIG. 2B, the RDAC 102B does not include an SAR logic circuit and a comparator. However, in some embodiments, the RDAC 102B receives the SAR control signal 213 from the SAR logic circuit 202 of the FADC 102A to control respective bit switches 256S$_1$ to 256S$_5$ and 258S$_1$ to 258S$_5$, wherein the SAR control signal 213 may be logically complementary to the SAR control signal 209. As such, every time the SAR control signal 209 is updated (e.g., changing one or more switching behaviors of the bit switches 206S$_1$ to 206S$_5$ and 208S$_1$ to 208S$_5$), the SAR control signal 213 may reflect the update accordingly.

Further, in some embodiments, the control logic circuit 182 may concurrently determines the operations modes of the FADC 102A and RDAC 102B. In other words, when the FADC 102A is in the sample mode (e.g., the switches 210/210' are turned on, and the switches 212/212' are coupled to 101-1 and 101-2, respectively), the RDAC 102B may also be in the sample mode (e.g., the switches 260/261' are turned on, and the switches 262/262' are coupled to 101-1 and 101-2, respectively) so as to allow the RDAC 102B to sample the differential input voltages 101-1 and 101-2 concurrently. And when the FADC 102A transitions to the hold mode (e.g., the switches 210/210' are turned off, and the switches 212/212' are coupled to the reference voltage 203), the RDAC 102B may also transition to the hold mode (e.g., the switches 260/261' are turned off, and the switches 262/262' are coupled to the reference voltage 203) so as to allow the RDAC 102B to concurrently output the differential residual signals 109-1 and 109-2 based on the SAR control signal 213.

Referring again to FIG. 4, the second SAR circuit 142 includes its own SAR logic circuit 402 and comparator 404 such that the second SAR circuit 142 may use the method 500 (SAR technique) of FIG. 5 to sample the amplified residual voltage signals 111 (111-1 and 111-2) and convert the amplified residual voltage signals 111 to the second digital signal 107, wherein logical states of bits of the second digital signal 107 are determined by the SAR logic circuit 402 using the above-described SAR technique. In some embodiments, a number of bits of the second digital signal 107 corresponds to the number of capacitors in the capacitor array 406/408 minus 1. In the illustrated embodiment of FIG. 4, the number of bits of the second digital signal 107, provided by the second SAR circuit 142, may be 7 (i.e., 8−1).

Figure 6:
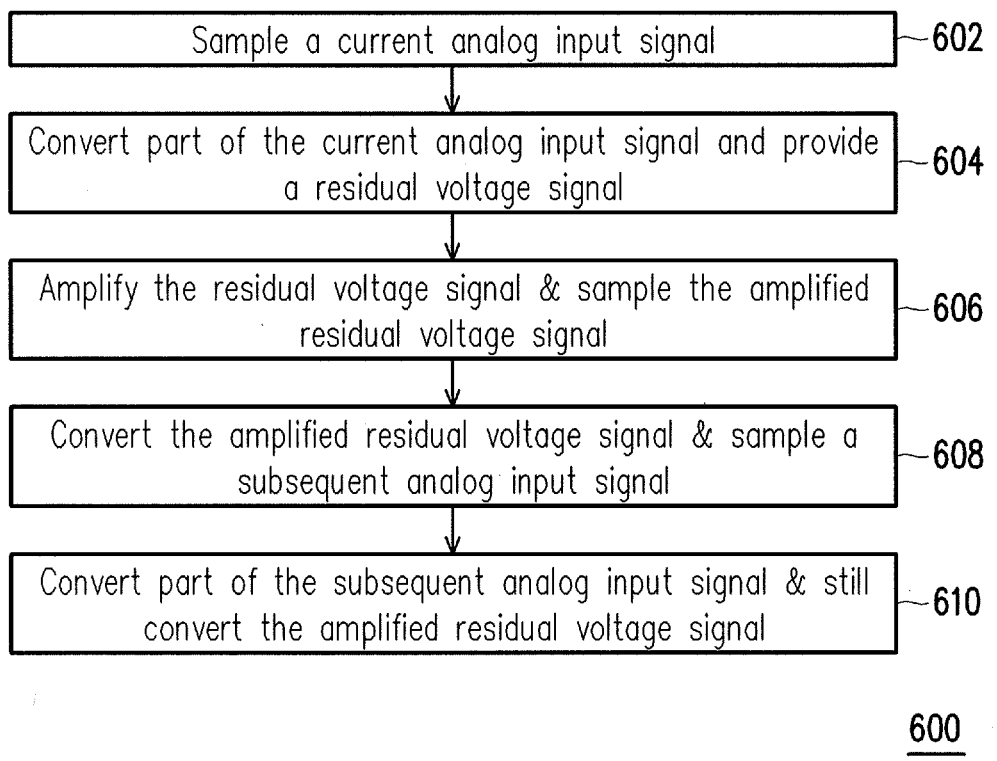
FIG. 6 illustrates an exemplary flow chart of a method for operating the hybrid ADC 100 of FIG. 1, in accordance with some embodiments.

FIG. 6 illustrates an exemplary flow chart of a method, in accordance with some embodiments. In various embodiments, the operations of the method 600 are performed by the respective components illustrated in FIGS. 1-4. For purposes of discussion, the following embodiment of the method 600 will be described in conjunction with FIGS. 1-4, and Table 1. The illustrated embodiment of the method 600 is merely an example. Therefore, it should be understood that any of a variety of operations may be omitted, re-sequenced, and/or added while remaining within the scope of the present disclosure.

The method 600 starts with operation 602 in which the current analog input signal 101 is sampled, in accordance with some embodiments. The operation 602 may correspond to phase 1 of the first iteration with respect to Table 1. In phase 1 of the first iteration, the FADC 102A (FIG. 2A) and RDAC 102B (FIG. 2B) of the first SAR circuit 102 are in the sample mode, which is also described in the operation 502 of the method 500 (FIG. 5). Moreover, while in phase 1 of the first iteration, the enable signal 305 of the RA circuit 122 (FIG. 3) is asserted to a logical 0 by the control logic circuit 182 so that the RA circuit 122 is disabled. As mentioned above, in phase 1 of such an initial iteration, the second SAR circuit 142 may be in the idle mode.

The method 600 continues to operation 604 in which part of the analog input signal 101 is converted to the first digital signal 105 and the residual voltage signal 109 is provided, in accordance with some embodiments. The operation 604 may correspond to phase 2 of the first iteration with respect to Table 1. In phase 2 of the first iteration, the FADC 102A (FIG. 2A) and RDAC 102B (FIG. 2B) of the first SAR circuit 102 are configured to convert part of the analog input signal 101 into the first digital signal 105 and provide the residual voltage signal 109, respectively. In some embodiments, the first digital signal 105 and the residual voltage signal 109 may be generated by using the SAR technique described in the operations 504-520 of the method 500 (FIG. 5). Moreover, while in phase 2 of the first iteration, the enable signal 305 of the RA circuit 122 (FIG. 3) may be asserted to a logical 1 by the control logic circuit 182 so that the RA circuit 122 is enabled. After being enabled, the RA circuit 122 transitions to the auto-zero mode that is configured to clear out an offset, if any, present at input terminals of the RA circuit 122. As mentioned above, in phase 2 of such an initial iteration, the second SAR circuit 142 may still be in the idle mode.

The method 600 continues to operation 606 in which the residual voltage signal 109 is amplified and the amplified residual signal 111 is sampled, in accordance with some embodiments. The operation 606 may correspond to phase 3 of the first iteration with respect to Table 1. In phase 3 of the first iteration, the RDAC 102B (FIG. 2B) of the first SAR circuit 102 is configured to hold the residual voltage signal 109. And, in some embodiments, the RA circuit 122 is configured to amplify the residual voltage signal 109 by using its inverters deployed in the first, second, and third stages (302, 304, and 306), respectively, so as to provide amplified residual signal 111 for the second SAR circuit 142 to sample.

The method 600 continues to operation 608 in which the subsequent analog input signal 101' is sampled and the amplified residual signal 111 is converted to the second digital signal 107, in accordance with some embodiments. The operation 608 may correspond to phase 1 of the second iteration with respect to Table 1. In phase 1 of the second iteration, the FADC 102A (FIG. 2A) and RDAC 102B (FIG. 2B) of the first SAR circuit 102 are again in the sample mode, and the RA circuit 122 is again disabled. However, the second SAR circuit 142 is configured to use the SAR technique described with respect to the method 500 of FIG. 5 to convert the amplified residual signal 111 to the second digital signal 107.

The method 600 continues to operation 610 in which part of the analog input signal 101' is converted to the first digital signal 105' and the amplified residual signal 111 is still being converted to the second digital signal 107, in accordance with some embodiments. The operation 610 may correspond to phase 2 of the second iteration with respect to Table 1. In some embodiments, after the second SAR circuit 142 finishes the conversion of the amplified residual signal 111 in phase 2 of the second iteration, the second digital signal 107 of the first iteration is provided to the error correction circuit 162.

As mentioned above, the error correction circuit 206 is configured to provide the digital output signal 103 that is representative of the analog inputs signal 101 in the digital format based on the first and second digital signals 105 and 107, wherein the first digital signal 105 represents the MSB portion of the digital output signal 103, and the second digital signal 107 represents the LSB portion of the digital output signal 103. The digital output signal 103 may include a number of bits that is a sum of bits of the MSB and LSB portions. In a non-limiting example, the MSB portion (i.e., the first digital signal 105), provided by the first SAR circuit 102 of the hybrid ADC 100, may have 4 bits, which corresponds to the number of capacitors of the first/second capacitor arrays 206/208 (FIG. 2A); and the LSB portion (i.e., the second digital signal 107), provided by the second SAR circuit 142 of the hybrid ADC 200, may have 7 bits, which corresponds to the number of capacitors of the first/second capacitor arrays 406/408 (FIG. 4). Therefore, the digital output signal 103 may have 11 bits.

In another example, the MSB portion provided by the first SAR circuit 102 of the hybrid ADC 100 may have 5 bits (4 bits plus 1 redundant bit for error correction) and the LSB portion provided by the second SAR circuit 142 of the hybrid ADC 100 may still have 7 bits. As such, although the error correction circuit 162 receives 12 bits from the first and the second SAR circuits 102 and 142, the error correction circuit 162 may provide the digital output signal 103 with 11 bits while using the redundant bit for correction.

In an embodiment, an analog-to-digital converter (ADC) circuit includes a first ADC stage comprising a first successive approximation register (SAR) circuit that is configured to convert a current analog input signal into a first digital signal corresponding to a most-significant-bits (MSB) portion of a current digital output signal, and to generate a residual voltage corresponding to a voltage value difference between the current analog input signal and the first digital signal; a second ADC stage, coupled to the first ADC stage, comprising an amplifier circuit that is configured to amplify the residual voltage; and a third ADC stage, coupled to the second ADC stage, comprising a second SAR circuit that is configured to convert the amplified residual voltage into a second digital signal corresponding to a least-significant-bits (LSB) portion of the current digital output signal when the first SAR circuit receives a subsequent analog input signal.

In another embodiment, an analog-to-digital converter (ADC) circuit includes a first ADC stage comprising a first successive approximation register (SAR) circuit that is configured to convert a current analog input signal into a first digital signal corresponding to a most-significant-bits (MSB) portion of a current digital output signal, and to generate a residual voltage corresponding to a voltage value difference between the current analog input signal and the first digital signal; a second ADC stage, coupled to the first ADC stage, comprising an amplifier circuit that is configured to amplify the residual voltage; and a third ADC stage, coupled to the second ADC stage, comprising a second SAR circuit that is configured to convert the amplified residual voltage into a second digital signal corresponding to a least-significant-bits (LSB) portion of the current digital output signal when the first SAR circuit receives a subsequent analog input signal and when the first SAR circuit converts the subsequent analog input signal into a third digital signal corresponding to a MSB portion of a subsequent digital output signal.

Yet in another embodiment, a method includes converting a current analog input signal into a first digital signal corresponding to a most-significant-bits (MSB) portion of a current digital output signal, and generating a residual voltage corresponding to a voltage value difference between the current analog input signal and the first digital signal; amplifying the residual voltage; and converting the amplified residual voltage into a second digital signal corresponding to a least-significant-bits (LSB) portion of the current digital output signal when receiving a subsequent analog input signal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter (ADC) circuit, comprising:
    a first ADC stage comprising a first successive approximation register (SAR) circuit that is configured to convert a current analog input signal into a first digital signal corresponding to a most-significant-bits (MSB) portion of a current digital output signal, and to generate a residual voltage corresponding to a voltage value difference between the current analog input signal and the first digital signal;
    a second ADC stage, coupled to the first ADC stage, comprising an amplifier circuit that is configured to amplify the residual voltage; and
    a third ADC stage, coupled to the second ADC stage, comprising a second SAR circuit that is configured to convert the amplified residual voltage into a second digital signal corresponding to a least-significant-bits (LSB) portion of the current digital output signal when the first SAR circuit receives a subsequent analog input signal.

2. The circuit of claim 1, wherein the second SAR circuit of the third ADC stage is further configured to convert the amplified residual voltage into the second digital signal corresponding to the LSB portion of the current digital output signal when the first SAR circuit converts the subsequent analog input signal into a third digital signal corresponding to a MSB portion of a subsequent digital output signal.

3. The circuit of claim 1, wherein the second SAR circuit of the third ADC stage is further configured to convert a previous analog input signal into a fourth digital signal corresponding to a LSB portion of a previous digital output signal.

4. The circuit of claim 1, wherein the first SAR circuit comprises:
    a fast analog-to-digital converter (FADC) circuit configured to provide the first digital signal; and
    a residue digital-to-analog converter (RDAC) circuit, coupled to FADC circuit, and configured to provide the residual voltage.

5. The circuit of claim 4, wherein the FADC circuit comprises:
    a first capacitor array comprising a plurality of capacitors, the capacitors of the first capacitor array each comprises a respective first side coupled with a first node, and a respective second side configured to be selectively coupled with one of an in-phase signal of the current analog input signal, a first reference voltage, and a second reference voltage;
    a second capacitor array comprising a plurality of capacitors, the capacitors of the second capacitor array each comprises a respective first side coupled with a second node, and a respective second side configured to be selectively coupled with one of an out-of-phase signal of the current analog input signal, the first reference voltage, and the second reference voltage;
a first comparator, coupled to the first and second nodes, and configured to provide a comparison result based on voltage levels present on the first and second nodes; and
a first SAR logic circuit, coupled to the first and second capacitor arrays, and the comparator, and configured to use the comparison result to provide a first SAR control signal so as to selectively couple the second side of each capacitor of the first capacitor array to either the first or second reference voltage, and to selectively couple the second side of each capacitor of the second capacitor array to either the first or second reference voltage.

6. The circuit of claim 5, wherein the FADC circuit is configured to provide the first digital signal based on the first SAR control signal.

7. The circuit of claim 5, wherein the RDAC circuit comprises:
a third capacitor array comprising a plurality of capacitors, the capacitors of the third capacitor array each comprises a respective first side coupled with a third node, and a respective second side configured to be selectively coupled with one of the in-phase signal of the current analog input signal, the first reference voltage, and the second reference voltage; and
a fourth capacitor array comprising a plurality of capacitors, the capacitors of the fourth capacitor array each comprises a respective first side coupled with a fourth node, and a respective second side configured to be selectively coupled with one of the out-of-phase signal of the current analog input signal, the first reference voltage, and the second reference voltage.

8. The circuit of claim 7, wherein the first SAR logic circuit of the FADC circuit is further configured to provide a second SAR control signal to selectively couple the second side of each capacitor of the third capacitor array of the RDAC circuit to either the first or second reference voltage, and to selectively couple the second side of each capacitor of the fourth capacitor array of the RDAC circuit to either the first or second reference voltage, the second SAR control signal being logically complementary to the first SAR control signal.

9. The circuit of claim 8, wherein the RDAC circuit is configured to provide the residual voltage based on the second SAR control signal.

10. The circuit of claim 1, wherein the amplifier circuit of the second ADC stage comprises:
a first stage comprising a first pair of differential inverters;
a second stage, coupled to the first stage, comprising a second pair of differential inverters; and
a third stage, coupled to the second stage, comprising a third pair of differential inverters.

11. The circuit of claim 1, wherein the second SAR circuit of the third ADC stage comprises:
a fifth capacitor array comprising a plurality of capacitors, the capacitors of the fifth capacitor array each comprises a respective first side coupled with a fifth node, and a respective second side configured to be selectively coupled with one of an in-phase signal of the amplified residual signal, a third reference voltage, and a fourth reference voltage;
a sixth capacitor array comprising a plurality of capacitors, the capacitors of the sixth capacitor array each comprises a respective first side coupled with a sixth node, and a respective second side configured to be selectively coupled with one of an out-of-phase signal of the amplified residual signal, the third reference voltage, and the fourth reference voltage;
a second comparator, coupled to the fifth and sixth nodes, and configured to provide a comparison result based on voltage levels present on the fifth and sixth nodes; and
a second SAR logic circuit, coupled to the fifth and sixth capacitor arrays, and second the comparator, and configured to use the comparison result to selectively couple the second side of each capacitor of the fifth capacitor array to either the third or fourth reference voltage, and to selectively couple the second side of each capacitor of the sixth capacitor array to either the third or fourth reference voltage.

12. An analog-to-digital converter (ADC) circuit, comprising:
a first ADC stage comprising a first successive approximation register (SAR) circuit that is configured to convert a current analog input signal into a first digital signal corresponding to a most-significant-bits (MSB) portion of a current digital output signal, and to generate a residual voltage corresponding to a voltage value difference between the current analog input signal and the first digital signal;
a second ADC stage, coupled to the first ADC stage, comprising an amplifier circuit that is configured to amplify the residual voltage; and
a third ADC stage, coupled to the second ADC stage, comprising a second SAR circuit that is configured to convert the amplified residual voltage into a second digital signal corresponding to a least-significant-bits (LSB) portion of the current digital output signal when the first SAR circuit receives a subsequent analog input signal and when the first SAR circuit converts the subsequent analog input signal into a third digital signal corresponding to a MSB portion of a subsequent digital output signal.

13. The circuit of claim 12, wherein the first SAR circuit comprises:
a fast analog-to-digital converter (FADC) circuit configured to provide the first digital signal; and
a residue digital-to-analog converter (RDAC) circuit, coupled to FADC circuit, and configured to provide the residual voltage.

14. The circuit of claim 13, wherein the FADC circuit comprises:
a first capacitor array comprising a plurality of capacitors, the capacitors of the first capacitor array each comprises a respective first side coupled with a first node, and a respective second side configured to be selectively coupled with one of an in-phase signal of the current analog input signal, a first reference voltage, and a second reference voltage;
a second capacitor array comprising a plurality of capacitors, the capacitors of the second capacitor array each comprises a respective first side coupled with a second node, and a respective second side configured to be selectively coupled with one of an out-of-phase signal of the current analog input signal, the first reference voltage, and the second reference voltage;
a first comparator, coupled to the first and second nodes, and configured to provide a comparison result based on voltage levels present on the first and second nodes; and
a first SAR logic circuit, coupled to the first and second capacitor arrays, and the comparator, and configured to use the comparison result to provide a first SAR control signal so as to selectively couple the second side of each capacitor of the first capacitor array to either the first or second reference voltage, and to selectively couple the second side of each capacitor of the second capacitor array to either the first or second reference voltage, and wherein the FADC circuit is configured to provide the first digital signal based on the first SAR control signal.

15. The circuit of claim 14, wherein the RDAC circuit comprises:
   a third capacitor array comprising a plurality of capacitors, the capacitors of the third capacitor array each comprises a respective first side coupled with a third node, and a respective second side configured to be selectively coupled with one of the in-phase signal of the current analog input signal, the first reference voltage, and the second reference voltage; and
   a fourth capacitor array comprising a plurality of capacitors, the capacitors of the fourth capacitor array each comprises a respective first side coupled with a fourth node, and a respective second side configured to be selectively coupled with one of the out-of-phase signal of the current analog input, signal, the first reference voltage, and the second reference voltage.

16. The circuit of claim 15, wherein the first SAR logic circuit of the FADC circuit is further configured to provide a second SAR control signal to selectively couple the second side of each capacitor of the third capacitor array of the RDAC circuit to either the first or second reference voltage, and to selectively couple the second side of each capacitor of the fourth capacitor array of the RDAC circuit to either the first or second reference voltage, the second SAR control signal being logically complementary to the first SAR control signal, and wherein the RDAC circuit is configured to provide the residual voltage based on the second SAR control signal.

17. The circuit of claim 12, wherein the amplifier circuit of the second ADC stage comprises:
   first stage comprising a first pair of differential inverters;
   a second stage, coupled to the first stage, comprising a second pair of differential inverters; and
   a third stage, coupled to the second stage, comprising a third pair of differential inverters.

18. The circuit of claim 12, wherein the second SAR circuit of the third ADC stage comprises:
   a fifth capacitor array comprising a plurality of capacitors, the capacitors of the fifth capacitor array each comprises a respective first side coupled with a fifth node, and a respective second side configured to be selectively coupled with one of an in-phase signal of the amplified residual signal, a third reference voltage, and a fourth reference voltage;
   a sixth capacitor array comprising a plurality of capacitors, the capacitors of the sixth capacitor array each comprises a respective first side coupled with a sixth node, and a respective second side configured to be selectively coupled with one of an out-of-phase signal of the amplified residual signal, the third reference voltage, and the fourth reference voltage;
   a second comparator, coupled to the fifth and sixth nodes, and configured to provide a comparison result based on voltage levels present on the fifth and sixth nodes; and
   a second SAR logic circuit, coupled to the fifth and sixth capacitor arrays, and second the comparator, and configured to use the comparison result to selectively couple the second side of each capacitor of the fifth capacitor array to either the third or fourth reference voltage, and to selectively couple the second side of each capacitor of the sixth capacitor array to either the third or fourth reference voltage.

19. An analog-to-digital converter (ADC) circuit, comprising:
   a first ADC stage comprising a first successive approximation register (SAR) circuit that is configured to convert a current analog input signal into a first signal corresponding to a most-significant-bits (MSB) portion of a current digital output signal, and to generate a residual voltage corresponding to a voltage value difference between the current analog input signal and the first digital signal;
   a second ADC stage, coupled to the first ADC stage, comprising an amplifier circuit that is configured to amplify the residual voltage; and
   a third ADC stage, coupled to the second ADC stage, comprising a second SAR circuit that is configured to concurrently convert the amplified residual voltage into a second digital signal corresponding to a least-significant-bits (LSB) portion of the current digital output signal when the first SAR circuit converts a subsequent analog input signal into a third digital signal corresponding to a MSB portion of a subsequent digital output signal.

20. The circuit of claim 19, wherein the second SAR circuit of the third ADC stage is further configured to convert a previous analog input signal into a fourth digital signal corresponding to a LSB portion of a previous digital output signal.

* * * * *